(12) United States Patent
Lautzenhiser et al.

(10) Patent No.: US 6,900,696 B2
(45) Date of Patent: May 31, 2005

(54) SHARED-CURRENT ELECTRONIC SYSTEMS

(75) Inventors: Barry Arthur Lautzenhiser, Carson City, NV (US); Lloyd Lynn Lautzenhiser, Sun Valley, NV (US)

(73) Assignee: Emhiser Research, Inc., Verdi, NV (US)

( * ) Notice: Subject to any disclaimer, the term of this patent is extended or adjusted under 35 U.S.C. 154(b) by 76 days.

(21) Appl. No.: 10/644,115

(22) Filed: Aug. 20, 2003

(65) Prior Publication Data

US 2004/0000952 A1 Jan. 1, 2004

Related U.S. Application Data

(63) Continuation-in-part of application No. 10/602,442, filed on Jun. 24, 2003, which is a continuation of application No. 10/028,844, filed on Dec. 20, 2001, now Pat. No. 6,683,499, and a continuation-in-part of application No. 10/177,572, filed on Jun. 21, 2002, now Pat. No. 6,747,517, and a continuation-in-part of application No. 10/091,056, filed on Mar. 4, 2002, now Pat. No. 6,690,238, and a continuation-in-part of application No. 10/028,844.
(60) Provisional application No. 60/258,341, filed on Dec. 27, 2000.

(51) Int. Cl.[7] .................................................. H03F 3/68
(52) U.S. Cl. ..................................... 330/295; 330/286
(58) Field of Search ............................ 330/295, 124 R, 330/286, 84, 277

(56) References Cited

U.S. PATENT DOCUMENTS 4,631,493 A  * 12/1986  Vendelin et al. ............ 330/277
5,256,987 A    10/1993  Kibayashi et al.
5,949,287 A  *  9/1999  Kurusu et al. ............... 330/277
6,163,220 A  * 12/2000  Schellenberg ............... 330/295

OTHER PUBLICATIONS

Kevin W. Kobayashi, Matt Nishimoto, Liem T. Tran, Huei Wang, John C. Cowles, Thomas Ray Block, Jeffrey H. Elliott, Barry R. Allen, Aaron K. Oki, and Dwight C. Streit, A 44–GHz High IP3 InP–HBT Amplifier with Practical Current Reuse Biasing, IEEE Transactions on Microwave Theory and Techniques, Dec., 1998, pp. 2541–2551, vol. 46, No. 12, Figure 6 and P. 2544, col. 2, last paragraph to p. 2545, col. 1, first 14 lines.

* cited by examiner

*Primary Examiner*—Henry Choe
(74) *Attorney, Agent, or Firm*—Wendell E. Miller, Patent Agent

(57) ABSTRACT

Shared-current electronic systems (10, 20, 26, 30, 38, 48, 66, 70, 82, 90, 96, 100, 104, 108, 118, and 122) include two or more solid-state electronic devices, such as a solid-state amplifying device Q1, a baseband processor 110, and a multiplier/upconverter 112, that are connected in dc series or dc series-parallel, and that either fixedly or variably share percentages of a dc supply voltage. Various embodiments produce separate rf outputs, variably shift the phase of a single rf output, variably shift rf power between/among rf outputs, or produce a frequency-compressed modulation. RF decoupling of the dc series-connected electronic devices comprises making an effective series resistance (ESR) of an rf decoupling capacitance lower than the ESR of a porcelain capacitor that resonates at the operating frequency of the electronic device that is being decoupled.

31 Claims, 11 Drawing Sheets

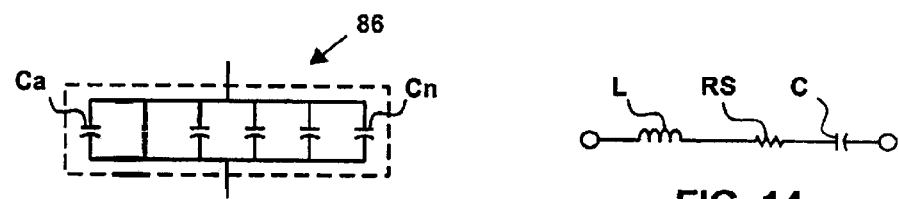
FIG. 15
FIG. 14
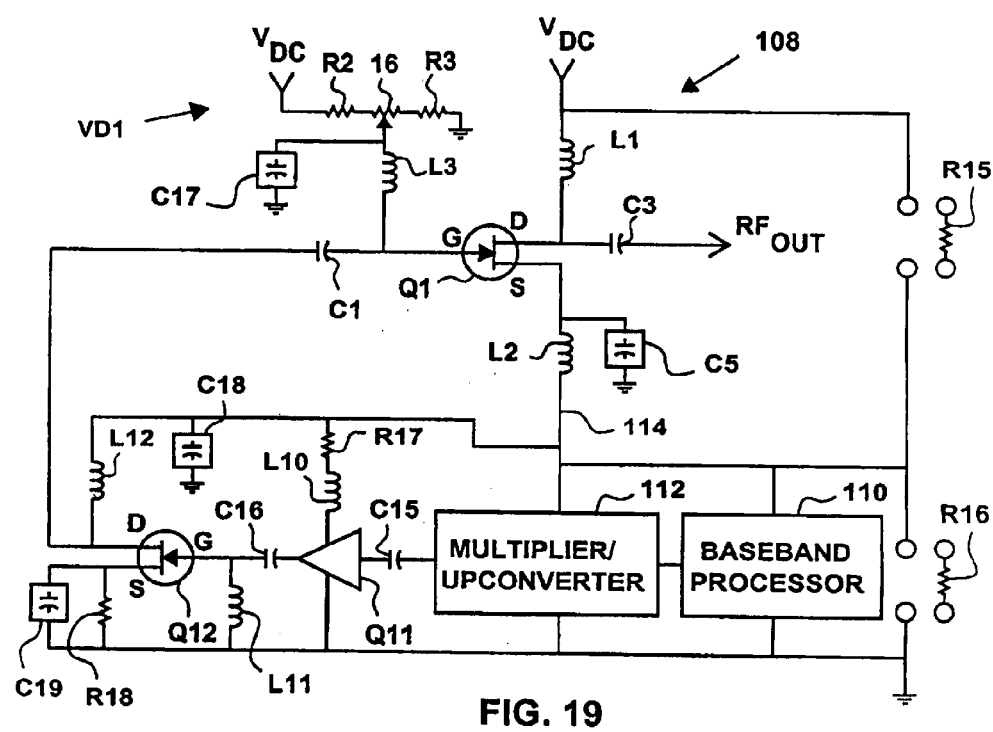
FIG. 19

SHARED-CURRENT ELECTRONIC SYSTEMS

CROSS-REFERENCES TO RELATED APPLICATIONS

This patent application is a Continuation-in-Part of U.S. patent application Ser. No. 10/602,442, filed Jun. 24, 2003, which is a Continuation of U.S. patent application Ser. No. 10/028,844, filed Dec. 20, 2001, now U.S. Pat. No. 6,683,499, which claims priority to Provisional Patent Application No. 60/258,341, filed Dec. 27, 2000, and is also a Continuation-in-Part of U.S. patent application Ser. Nos. 10/177,572, filed Jun. 21, 2002, now U.S. Pat. No. 6,747,517, Ser. No. 10/091,056, filed Mar. 4, 2002, now U.S. Pat. No. 6,690,238, and Ser. No. 10/028,844, filed Dec. 20, 2001, now U.S. Pat. No. 6,683,499, which all claim priority to Provisional Patent Application No. 60/258,341, filed Dec. 27, 2000.

STATEMENT RE FEDERALLY SPONSORED RESEARCH OR DEVELOPMENT

Not Applicable

REFERENCE TO SEQUENCE LISTING

Not Applicable

BACKGROUND OF THE INVENTION

1. Field of the Invention

The present invention relates generally to connecting electronic devices in dc series, and in either rf series or parallel. More particularly, the present invention pertains to connecting electronic devices in dc series, equally, proportionally, and/or variably dividing a dc source voltage between, or among, the electronic devices, and rf decoupling the series-connected electronic devices.

2. Description of the Related Art

Frequently, maximum operating voltages of solid-state electronic devices are too low for the dc source voltage that is available. By connecting the solid-state electronic devices in dc series, the dc source voltage may be divided between, or among, a plurality of solid-state electronic devices, either equally or proportionally, as desired, thereby providing dc voltages that are usable for any desired type of solid-state electronic device. Because, in schematic drawings, the solid-state electronic devices are shown stacked on top of each other, this type of circuit has come to be known as a "totem pole" circuit. Herein this type of circuit is called a "shared-current electronic system."

Further, the dc source voltage may be divided variably, as will be shown subsequently. In addition, as will be shown subsequently, other types of electronic devices, such as oscillators, may be connected in a totem-pole arrangement, either with or without solid-state electronic devices. The inputs and outputs of the electronic devices, whether rf or lower frequencies, may be connected in either series or parallel.

As an example of equal or proportional division of the dc source voltage, gallium arsenide field-effect transistors (GaAsFETs) are the primary solid state devices used for amplification of high frequency signals in the range of 3 GHz and higher. GaAsFETs have the advantages of being readily available and relatively inexpensive. However, a major disadvantage of GaAsFETs is that the maximum operating voltage is commonly +10.0 volts dc.

For many transmitter/amplifier applications, particularly airborne applications, the dc supply voltage is 28.0 volts dc, plus or minus 4.0 volts dc. Since gallium arsenide FETs have an operative voltage of +10.0 volts dc, the use of gallium arsenide FETs has presented a problem.

Traditionally, there have been two solutions to this problem. One is to use a linear voltage regulator. The other is to use a switching regulator.

In linear voltage regulators, the voltage is linearly regulated from the supply of 28.0 volts to approximately 10.0 volts with the power difference being dissipated in heat by the regulator. This type of regulation has the disadvantages of excessive heat generation and low power efficiency.

Switching regulators, on the other hand, are power converters that transfer the power of a higher voltage supply to a lower voltage with increased current capacity. This type of regulation has the advantage of low heat dissipation and high power efficiency, but has the disadvantages of increased cost; space inefficiency, due to large size; and the creation of a spurious signal on the rf carrier (EMI problems) due to the switching action of the regulator. A high-attenuation filter is required to suppress this spurious switching signal.

A third approach to solving the problem of disparity between the operating voltage of solid-state devices and a dc source voltage has been to connect the solid-state electronic devices in dc series, thereby dividingly sharing the dc source voltage and utilizing the same current flow. This shared-current approach was presented in *IEEE Transactions on Microwave Theory and Techniques*, Volume 46, Number 12, of December 1998, in an article entitled "*A 44-GHz High IP3 InP-HBT Amplifier with Practical Current Reuse Biasing.*"

Shared-current electronic systems solve the problem of the disparity between the operating voltage of solid-state devices and a higher supply voltage. Two or more solid-state electronic devices are connected in series for dc operation, but they are connected in parallel for rf operation.

That is, current that flows in series through the solid-state devices is used two, or more, times in the production of the rf output. The dc current is used once in each of two, or more, series-connected solid-state electronic devices, thereby increasing the rf output for a given current flow, as compared to rf amplifiers connected in the conventional fashion.

However, shared-current electronic systems have been used only at low rf powers, as in the above-referenced article wherein the power was in the order of 100.0 milliwatts. At higher rf powers, problems associated with inadequate rf decoupling have included low power efficiency, oscillation, a decrease in reliability of the circuits, and destruction of the solid-state devices.

The problem of rf decoupling intensifies for rf amplifiers that operate over a wide band of frequencies. However, in U.S. patent application Ser. No. 10/028,844, which is incorporated herein by reference thereto, Lautzenhiser et al. solve the problem of rf decoupling for both narrow-band and wide-band rf amplifiers.

While one reason for connecting solid-state devices includes the low operating voltages of GaAsFETs, some dc source voltages are too high for other types of solid-state devices. For instance, some telephone systems operate at 50.0 volts, which is too high for many solid-state electronic devices, such as some bipolar-junction transistors, some MOSFETs, and some J-FETs. Therefore, a basic reason for connecting solid-state devices in dc series is to provide a compatible operating voltage without incurring the power loss of a linear regulator or the noise of a switching regulator.

Another reason for connecting solid-state devices in series is to variably proportion the dc source voltage between, or among, two or more solid-state electronic devices.

The dc source voltage may be variably proportioned for the purpose of variably shifting or proportioning, or even rapidly switching, rf power from one antenna to another, as taught by Lautzenhiser et al. in U.S. patent application Ser. No. 10/177,572, filed Jun. 21, 2002, which is incorporated herein by reference thereto.

The dc source voltage may also be variably proportioned between, or among, two or more solid-state electronic devices for the purpose of phase shifting an rf output as taught by Lautzenhiser et al. in U.S. patent application Ser. No. 10/091,056, filed Mar. 4, 2002, which is incorporated herein by reference thereto.

Further, as taught herein, a solid-state electronic device, such as a FET, may be connected in dc series with a processing electronic device, such as an oscillator or a baseband processor, that may include hundreds of discrete components. By dc series-connecting the solid-state electronic device and the processing electronic device in dc series, and proportionally dividing the dc source voltage between the devices, a dc voltage suitable for each device is provided, the dc current is shared, the use of a voltage regulator is obviated, and power efficiency is increased greatly.

An important use of shared-current electronic systems is in spectrally efficient digital modulation systems such as SOQPSK (Tier I) or multi-h CPM (Tier II) in which the quantity of data in a given bandwidth is doubled or tripled respectively as compared to the PCM/FM (Tier O) waveform. Importantly, the shared-current principle also increases the power efficiency of electronic systems that use Tier O and Tier II waveforms, since all three waveforms (Tier O, Tier I, and Tier II) may be produced by the same hardware by making a change in the software.

In shared-current electronic systems, problems with rf decoupling are most severe between the solid-state devices. For instance, when using FETs, decoupling is the most critical with regard to a source terminal of any FET that is connected to a drain terminal of a next-lower FET. Capacitors and rf chokes are used for rf decoupling and rf isolating, but selection and design of capacitor decoupling is the most critical.

The next most critical location for rf decoupling is the source terminal of the lower FET when the source terminal of the lower FET is connected to an electrical ground through a resistor, as shown herein. However, if a negative bias voltage is used for the gate of the lower FET, and the source is connected directly to an electrical ground, this source terminal is already rf decoupled. Again, selection and design of capacitors used for rf decoupling is critical.

Other critical rf decoupling problems are those associated with the supply voltage to the drain of the upper FET and bias voltages to the gates of the FETs. The use of properly designed rf chokes are sufficient to provide adequate rf decoupling in these locations.

Unless rf decoupling is provided as taught herein, reduced efficiency will certainly occur, and both instability and destruction of the solid-state electronic devices may occur. More particularly, if one of the solid-state electronic devices goes into unstable self-oscillation, it will consume more dc bias and most likely become over biased resulting in destruction of the solid-state device.

In a shared-current configuration that uses FETs, all FETs may be destroyed if one FET fails, depending on how the first FET fails. For example, if the upper FET oscillates and consumes the dc bias, it will be over-biased and will be destroyed. If, in the destruction, the drain and source short circuit, which is a common type of failure, the lower FET will be over-biased, too, so that the lower FET will also fail.

In short, inadequate rf decoupling, at the very least results in poor efficiency. At the worst, and with higher likelihood at higher rf outputs, it results in destruction of the FETs and/or damage or destruction of circuits connected to the FET inputs and outputs.

BRIEF SUMMARY OF THE INVENTION

In the present invention, two or more solid-state electronic devices, or at least one solid-state electronic device and at least one other electronic device, are connected in series between positive and negative terminals of a dc source voltage, thereby dividing the dc source voltage between or among the electronic devices. The solid-state electronic devices may be gallium arsenide field-effect transistors (GaAsFETs) or any other type of solid-state electronic device. All of the series-connected electronic devices may use the same current flow, or some current may be bypassed around an electronic device that uses less current than another current-sharing device.

Alternately, two solid-state electronic devices that use less current are connected in parallel in a stack with two or more solid-state electronic devices to best utilize, not only the supply voltage, but also the current required by the power-amplifying FETs.

If the solid-state electronic devices are field-effect transistors (FETs), the FETs are stacked like a totem pole with the drain of a top, or upper, FET being operatively connected to a relatively high positive potential, a source terminal of the top FET being connected to a drain terminal of a lower FET, and a source terminal of the lower FET being connected to a lower voltage.

In some embodiments, an rf power-splitter is used to split the rf input two or more ways for the gates of the FETs. In various ones of the embodiments, an rf power combiner is connected to the drain terminals of the FETs to combine the rf outputs.

A negative gate-to-source bias for the lower FET controls current flow through all FETs, which in turn controls power amplification. Various embodiments of the present invention control the gate-to-source bias of the lower FET in unique and useful ways, thereby providing unique and useful ways of controlling both current flow through the FETs and amplification of the rf power amplifier.

In addition to proportioning a dc source voltage between, or among, a plurality of solid-state amplifying devices in fixed proportions for the purpose of providing dc voltages that are usable by various types of solid-state amplifying devices, the dc source voltage may be variably proportioned between, or among, a plurality of solid-state amplifying devices.

The dc source voltage may be variably proportioned for the purpose of variably shifting a phase angle of an rf output, or the dc source voltage may be variably proportioned for the purpose of shifting rf power from one rf output and an antenna to another rf output and its antenna.

While in some embodiments of the present invention a power combiner is used to combine the rf signals after being power amplified by the FETs, in other embodiments, the rf signals are used separately.

In still other embodiments, separate rf inputs, which may be at different frequencies, different levels, and different modulation types, are separately amplified, and then combined to produce both rf signals in a single rf output.

Finally, a solid-state electronic device may be connected in dc series with a processing electronic device that may include hundreds of discrete solid-state components. For instance, Shaped-Offset QPSK modulation (SOQPSK) is power inefficient because of the current flow that is required for modulated signal generation. However, by using the same current, both for modulated signal generation and rf power amplification, as taught herein, overall power efficiency is improved greatly.

The design and selection of the dc bias, rf chokes, and rf decoupling capacitors are critical to the operation and performance of current-sharing rf amplifier circuits, particularly in high-power rf applications.

Improperly designed dc bias circuits can result in a reduction of power efficiency, destruction of one or more amplifying FETs, or a decrease of the reliability in the solid-state devices, especially at all but the lowest rf powers.

For maximum power efficiency, rf chokes must be chosen to prevent coupling of the rf signal onto the dc power lines and to obtain maximum isolation between the series FETs, and thereby to prevent rf crosstalk.

Conventionally, rf power amplifying J-FETs are biased with a negative dc voltage applied to the gate terminal, a positive power supply dc voltage applied to the drain terminal, and the source terminal attached to a circuit ground. Preferably, however, as shown and taught herein, the source terminal of the lower FET is connected to an electrical ground through a resistor, thereby causing the FET to self-bias, eliminating the need for a negative voltage for the gate terminal.

As taught herein, selectively-chosen rf decoupling capacitors that are attached to the source terminals of the FETs result in minimal rf impedance to a circuit ground, thereby achieving maximum power efficiency and circuit stability. Except for very low rf outputs, proper rf decoupling of source terminals of FETs, and similar terminals for other types of solid-state electronic devices, requires two things: the decoupling capacitors must have self-resonant frequencies that match the output frequency, and the effective series resistances (ESRs) of the decoupling capacitors must be extremely low, usually lower than is available even in porcelain capacitors. Therefore, in the present invention, two or more decoupling capacitors are paralleled, thereby reducing the ESR.

In a first aspect of the present invention, an electronic apparatus comprises: a solid-state electronic device that includes higher and lower dc voltage terminals; an other electronic device that includes higher and lower dc voltage terminals; means, comprising means for connecting the lower dc voltage terminal of one of the electronic devices to the higher dc voltage terminal of an other of the electronic devices, for connecting the electronic devices in dc series between a dc source terminal and an electrical ground; means, comprising a capacitor that is connected between the lower dc voltage terminal of the one electronic device and the electrical ground, for rf decoupling the dc series-connected electronic devices; and the means for rf decoupling further comprises means for making an effective series resistance, between the lower dc voltage terminal of the one electronic device and the electrical ground, lower than a porcelain capacitor that resonates at an rf frequency of the one electronic device.

In a second aspect of the present invention, electronic apparatus comprises: a first electronic device that includes higher and lower dc voltage terminals; a second electronic device that includes higher and lower dc voltage terminals; means, comprising means for connecting the lower dc voltage terminal of one of the electronic devices to the higher dc voltage terminal of an other of the electronic devices, for connecting the electronic devices in dc series between a dc source terminal and an electrical ground; means for proportioning first and second percentages of a dc source voltage, when applied to the dc source terminal, to the first and second electronic devices, respectively; means, comprising a capacitor that is connected between the lower dc voltage terminal of the one electronic device and the electrical ground, for rf decoupling the dc series-connected electronic devices; and the means for rf decoupling further comprises means for making an effective series resistance, between the lower dc voltage terminal of the one electronic device and the electrical ground, lower than a porcelain capacitor that resonates at an rf frequency of the one electronic device.

In a third aspect of the present invention, electronic apparatus comprises: a baseband processing device having higher and lower dc voltage terminals; a solid-state electronic device, having higher and lower dc voltage terminals; means for delivering an rf signal from the baseband processing device to the solid-state electronic device; means, comprising means for connecting the lower dc voltage terminal of one of the devices to the higher dc voltage terminal of an other of the devices, for connecting the devices in dc series between a dc source terminal and an electrical ground; means for proportioning first and second percentages of a dc supply voltage, when applied to the dc source terminal, to respective ones of the devices; and means, comprising a capacitor that is connected between the lower dc voltage terminal of the one electronic device and the electrical ground, for rf decoupling the dc series-connected electronic devices.

In a fourth aspect of the present invention, electronic apparatus comprises: a baseband processing device having higher and lower dc voltage terminals; a multiplier/up-converter being connected in rf series to the baseband processing device; a solid-state amplifying device having higher and lower dc voltage terminals; means for connecting the solid-state amplifying device in rf series to the multiplier/up-converter; means, comprising means for connecting the lower dc voltage terminal of the solid-state amplifying device to the higher dc voltage terminal of the baseband processing device, for connecting the solid-state amplifying device and the baseband processing device in dc series between a dc source terminal and an electrical ground; means for proportioning first and second percentages of a dc supply voltage, when applied to the dc source terminal, to the solid-state amplifying device and to the baseband processing device, respectively; and means, comprising a capacitor that is connected between the lower dc voltage terminal of the solid-state amplifying device and the electrical ground, for rf decoupling the solid-state amplifying device and the baseband processing device.

In a fifth aspect of the present invention, a method for processing rf signals comprises: connecting a solid-state electronic device and an other electronic device in dc series between a dc source voltage and an electrical ground; the connecting step comprises connecting a lower dc voltage terminal of one of the electronic devices to an rf choke, and connecting the rf choke to a higher dc voltage terminal of an other of the electronic devices; separately processing rf signals in the electronic devices; proportioning first and second percentages of the dc source voltage to separate ones of the electronic devices; rf decoupling the electronic devices; and the rf decoupling step comprises providing a capacitance between the lower dc voltage terminal and the electrical ground that is lower than an effective series resistance of a porcelain capacitor that resonates at an rf frequency of the one electronic device.

In a sixth aspect of the present invention, a method for processing rf signals comprises: connecting first and second electronic devices in dc series between a dc source voltage and an electrical ground; separately processing rf signals in the first and second electronic devices; proportioning first and second percentages of the dc source voltage between the first and second electronic devices; rf decoupling the electronic devices; and the rf decoupling step comprises providing a capacitance, between a lower dc voltage terminal of an upper one of the electronic devices and the electrical ground, that is lower than an effective series resistance of a porcelain capacitor that resonates at an rf frequency of the first electronic device.

In a seventh aspect of the present invention, a method for processing rf signals comprises: rf connecting a baseband processing device and a solid-state electronic device; connecting the solid-state electronic device and the baseband processing device in dc series between a dc source terminal and an electrical ground; the dc series-connecting step comprises connecting a lower dc voltage terminal of one of the devices to a higher dc voltage terminal of an other of the devices; applying a dc source voltage to the dc source terminal; separately proportioning first and second percentages of the dc source voltage to the devices; rf decoupling the devices; and the rf decoupling step comprises connecting a capacitor between the lower dc voltage terminal of the one device and the electrical ground.

In an eighth aspect of the present invention, a method for processing rf signals comprises: rf connecting a baseband processing device to a multiplier/up-converter; rf connecting the multiplier/up-converter to a solid-state amplifying device; connecting the solid-state amplifying device and the baseband processing device in dc series with a dc source terminal and an electrical ground; the dc series-connecting step comprises connecting a lower dc voltage terminal of the solid-state amplifying device to an rf choke, and connecting the rf choke to a higher dc voltage terminal of the baseband processing device; applying a dc source voltage to the dc source terminal; proportioning first and second percentages of the dc source voltage to separate ones of the devices; rf decoupling the solid-state amplifying device and the baseband processing device; and the rf decoupling step comprises connecting a capacitor between the lower dc voltage terminal and the electrical ground.

BRIEF DESCRIPTION OF THE SEVERAL VIEWS OF THE DRAWINGS

FIG. 14 is a model for simulating a microwave capacitor;

FIG. 15 is a low ESR capacitor assembly in which the effective series resistance (ESR) of rf decoupling capacitances are reduced below the ESR of any porcelain capacitor, that resonates at an operating frequency, by paralleling a plurality of capacitors, which is used in all of the shared-current electronic systems taught herein;

FIG. 19 is a frequency-compression electronic system, or a shared-current electronic system, in which an rf output GaAsFET shares current with a baseband processing device, a multiplier/up-converter, a gain block, and a driver GaAsFET;

DETAILED DESCRIPTION OF THE INVENTION

Figure 1:
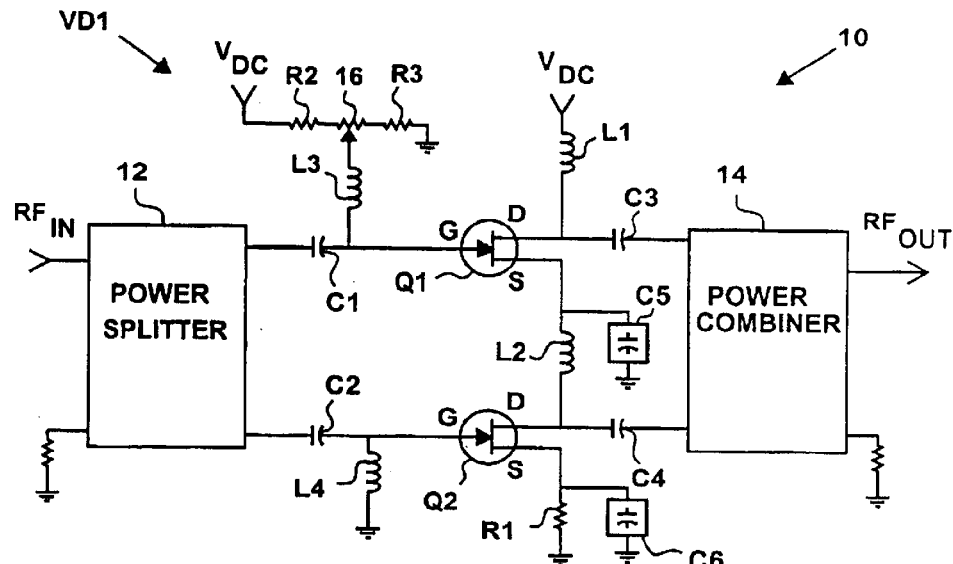
FIG. 1 is an rf power amplifier, or a shared-current electronic system, of the present invention in which two n-channel, gallium arsenide FETs are stacked to proportionately share, or dividingly share, the dc supply voltage, and rf decoupling is included as taught in conjunction with FIG. 15.

Referring now to FIG. 1, an rf power amplifier, or shared-current electronic system, 10 includes solid-state amplifying devices, solid-state electronic devices, n-channel gallium arsenide field-effect transistors, GaAsFETs, or FETs, Q1 and Q2 that are connected in series between a positive supply voltage, or source voltage, $V_{DC}$ and an electrical ground.

A first rf choke L1 connects the supply voltage $V_{DC}$ to a drain terminal of the FET Q1, a second rf choke L2 connects a source terminal of the FET Q1 to a drain terminal of the FET Q2, and a resistor R1 connects a source terminal of the FET Q2 to the electrical ground.

The rf power amplifier 10 also includes an rf power splitter 12 and an rf power combiner 14. The rf power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to the electrical ground by decoupling capacitors C5 and C6, which are represented schematically by boxes that are labeled C5 and C6.

A variable voltage divider VD1, that includes a potentiometer 16 and resistors R2 and R3, is connected to the supply voltage $V_{DC}$ and supplies a bias voltage to the gate terminal of the FET Q1 through a third rf choke L3. The resistor R1 supplies a negative gate-to-source bias for the gate terminal of the FET Q2 through a fourth rf choke L4.

The resistor R1, in setting the gate-to-source bias for the FET Q2, controls current flow through both FETS, Q1 and Q2. It is important to remember this fact, since other embodiments of the present invention use various means for controlling the gate-to-source bias for the FET Q2, thereby providing means for controlling power amplification of the rf power amplifier 10.

Continuing to refer to FIG. 1, if the supply voltage is 22.0 volts dc, and if the resistor R1 provides a 2.0 voltage drop between the source terminal of the FET Q2 and the ground, assuming equal current through the FETS, Q1 and Q2, the remaining 20.0 volts will be equally divided, thereby providing 10.0 volts for each FET, Q1 and Q2, with the FET Q1 having 22.0 volts applied to the drain terminal and 12.0 volts applied to the source terminal.

If the potentiometer 16 of the variable voltage divider VD1 is proportioned to provide 10.0 volts to the gate terminal of the FET Q1, a negative gate-to-source bias of 2.0 volts will be provided for the FET Q1. In like manner, with 12.0 volts being applied to the drain terminal of the FET Q2 and 2.0 volts being applied to the source terminal, the electrical ground will be 2.0 volts below the voltage that is applied to the source terminal, thereby providing a negative gate-to-source bias of 2.0 volts for the FET Q2, since the gate terminal of the FET Q2 is connected to the electrical ground through the rf choke L4.

In operation, an input signal at an rf input $RF_{IN}$ is split in the rf power splitter 12, amplified in the FETs Q1 and Q2, and combined in the rf power combiner 14 to provide a power amplified output at an rf output $RF_{OUT}$.

The amplification function of the FETs Q1 and Q2 is maintained by using rf chokes, L1, L2, L3, and L4, to keep the rf signal from coupling onto the dc bias lines and to prevent rf interference between FETs Q1 and Q2. Decoupling capacitors C5 and C6 are used to keep the source terminals of both FETs, Q1 and Q2, at an rf ground.

The performance of the rf power amplifier 10, and all of the current-sharing electronic systems taught herein, rests heavily on correct design and application of the rf chokes, L1, L2, L3, and L4, and especially on the decoupling capacitors, C5 and C6. Since capacitor decoupling is especially critical, the design and selection of decoupling capacitors will be considered in greater detail subsequently.

Figure 2:
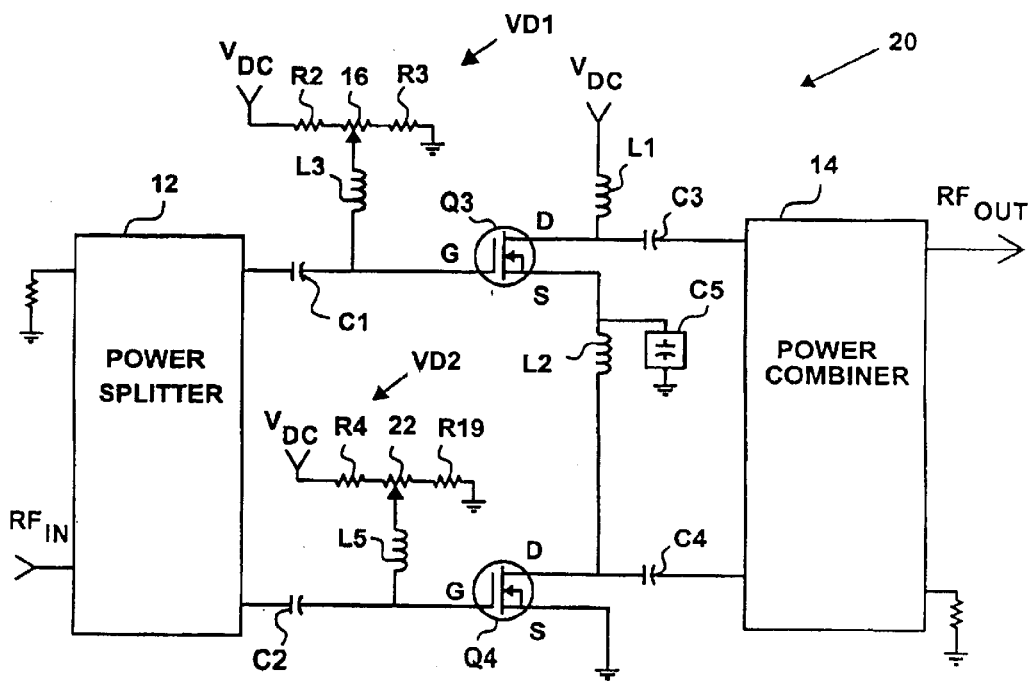
FIG. 2 is an rf power amplifier, or a shared-current electronic system, that is similar to FIG. 1, except that the GaAsFETs of FIG. 1 have been replaced by n-channel MOSFETs.

Referring now to FIG. 2, an rf power amplifier, or shared-current electronic system, 20 includes like-numbered and like-named parts, as shown and described in conjunction with FIG. 1, except the rf power amplifier 20 of FIG. 2 replaces the GaAsFETs Q1 and Q2 of FIG. 1 with MOSFETs, FETs, solid-state amplifying devices, or solid-state electronic devices, Q3 and Q4 that are connected in series between a positive supply voltage $V_{DC}$ and an electrical ground.

The MOSFET Q4 operates with a positive bias, so the resistor R1 and the decoupling capacitor C6, both of FIG. 1, have been omitted, and a variable voltage divider VD2, that includes a potentiometer 22 and resistors R4 and R19, has been added to provide a bias voltage for the MOSFET Q4. The variable voltage divider VD2 is connected to a gate of the MOSFET Q4 by an rf choke L5.

The rf power amplifier 20 takes advantage of the fact that MOSFETs, such as the MOSFETs Q3 and Q4, will operate at higher voltages than GaAsFETs, such as the GaAsFETs Q1 and Q2 of FIG. 1. For instance, the rf power amplifier 20 may use a 56.0 volt dc source, and the dc source voltage may be equally divided between MOSFETs Q3 and Q4 which are rated for 28 volts dc.

If a 56.0 volt dc source voltage is equally divided, the gate voltage for the MOSFET Q3 is adjusted to 32.0 volts by the variable voltage divider VD1, so that the gate of the MOSFET Q3 is 4.0 volts above its source voltage, such as to set the quiescent operating point of the MOSFET Q3. In like manner, the variable voltage divider VD2 is adjusted to 4.0 volts, so that the gate of the MOSFET Q4 is 4.0 volts above its electrically-grounded source terminal.

Figures 3, 4:
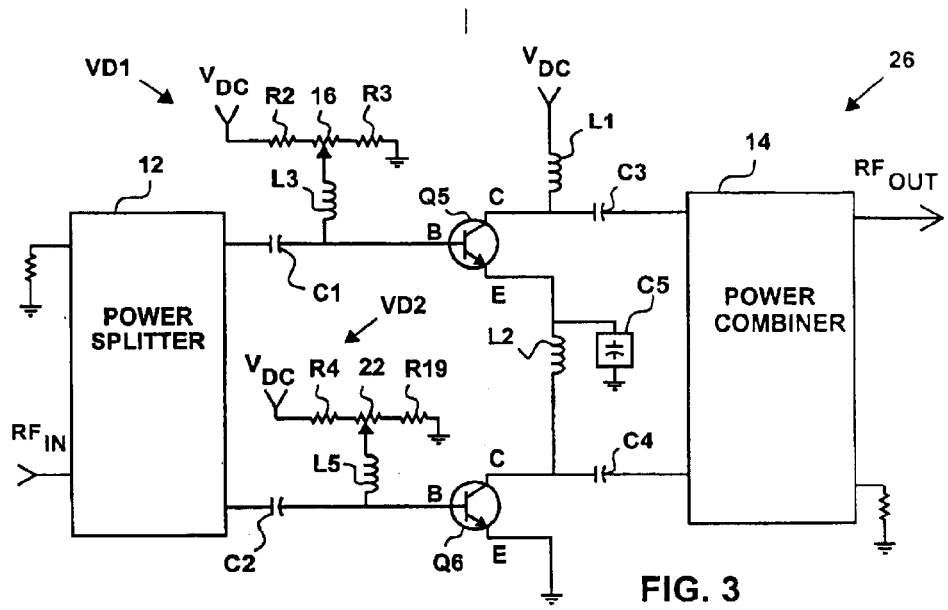
FIG. 3 is an rf power amplifier, or a shared-current electronic system, that is similar to FIG. 1, except that the GaAsFETs of FIG. 1 have been replaced by npn bipolar-junction transistors (BJTs)
FIG. 4 is an rf power amplifier, or a shared-current electronic system with a series driver amplifier, that uses rf feedback to control the rf output power.

Referring now to FIG. 3, an rf power amplifier, or shared-current electronic system, 26 includes like-numbered and like-named parts, as shown and described in conjunction with FIG. 1, except that the rf power amplifier 26 of FIG. 3 replaces the GaAsFETs Q1 and Q2 of FIG. 1 with npn bipolar-junction transistors (BJTs), solid-state amplifying devices, or solid-state electronic devices, Q5 and Q6 that are connected in series between a positive supply voltage $V_{DC}$ and a ground.

Since the BJT Q6 operates with a positive bias, the resistor R1 and the decoupling capacitor C6, both of FIG. 1, have been omitted, the variable voltage divider VD2, that includes the potentiometer 22 and the resistors R4 and R19, has been added. The variable voltage divider VD2 is connected to a base of the BJT Q6 by the rf choke L5.

The rf power amplifier 26 takes advantage of the fact that bipolar-junction transistors (BJTs), such as the BJTs Q5 and Q6, will operate at higher voltages than GaAsFETs, such as the GaAsFETs Q1 and Q2 of FIG. 1. For instance, the rf power amplifier 26 may use a 56.0 volt dc source, and the dc source voltage may be equally divided between the BJTs Q5 and Q6.

If a 56.0 volt dc source voltage is equally divided, the base voltage for the BJT Q5 is adjusted to 28.7 volts by the variable voltage divider VD1, so that the base of the BJT Q5 is 0.7 volts above its emitter voltage. In like manner, the variable voltage divider VD2 is adjusted to 0.7 volts, so that the base of the BJT Q6 is 0.7 volts above its grounded emitter.

Operation of the rf power amplifiers, or shared-current electronic systems, 20 and 26, of FIGS. 2 and 3 respectively, can be understood by referring to the detailed description of FIG. 1.

Referring now to FIG. 4, an rf power amplifier, or shared-current electronic system, 30 includes like-named, like-numbered, and like-functioning parts as those of FIG. 1. In addition, the rf power amplifier 30 includes a FET Q7 that is in a current-sharing arrangement with the FETs Q1 and Q2, so that the FETs Q1, Q2, and Q7 share the supply voltage. The FET Q7 is connected as a driver for the FETs Q1 and Q2.

Bias for the gate of the FET Q2 is supplied by the variable voltage divider VD2 that is connected to the gate of the FET Q2 by an rf choke L5. The variable voltage divider VD2 includes the potentiometer 22 and the resistors R4 and R19.

A drain terminal of the FET Q7 is connected to the source terminal of the FET Q2 by an rf choke L6, and the drain terminal of the FET Q7 is connected to the rf input $RF_{IN}$ of the power splitter 12 by a coupling capacitor C7, a source terminal of the FET Q7 is connected to an electrical ground through a resistor R5, a gate terminal of the FET Q7 is connected to the electrical ground through an rf choke L7, and a second rf input $RF_{IN2}$ is connected to the gate terminal of the FET Q7 by a coupling capacitor C8. A decoupling capacitor C9 is connected between the source terminal of the FET Q7 and the electrical ground.

Since the rf power amplifier 30 includes three FETs, Q1, Q2, and Q7, that are stacked in a current-sharing arrangement, they all share the supply voltage, even though the FET Q7 is configured as the driver for the FETs Q1 and Q2. The driver, FET Q7, is self-biased by the resistor R5, to drive the two final-stage power FETs Q1 and Q2. But a negative gate-to-source bias for the FET Q2 is supplied by the variable voltage divider VD2. The variable voltage divider VD2 includes the potentiometer 22 and the resistors R4 and R19.

Since the FETs Q1 and Q2 each use about 10.0 volts of the total supply voltage, the voltage remaining for use with other solid-state amplifying devices in the stack, such as the FET Q7, is limited. Therefore, the FET Q7 is self-biased to a quiescent point close to saturation (Idss) to result in a lower drain-to-source bias. Further, as stated above, the bias voltage on the gate of the FET that is on the bottom of the stack sets the current for all FETs in the stack.

If the current flow through the FET Q7 is insufficient for required current flow through the FETs Q1 and Q2, a resistor (not shown) could be used to bypass current flow around the FET Q7, thereby increasing current flow through the FETs Q1 and Q2. Instead, a bipolar-junction transistor Q8 is added in parallel with the FET Q7, thereby increasing the current flow through the FETs Q1 and Q2 by bypassing current to the electrical ground through a resistor R6.

A power detector 32 and a conditioner 34 are used to feedback a signal from the rf output $RF_{OUT}$ to control the base terminal of the bipolar-junction transistor Q8, thereby flattening the rf output $RF_{OUT}$ with respect to frequency, voltage, temperature, and time.

Figure 5:
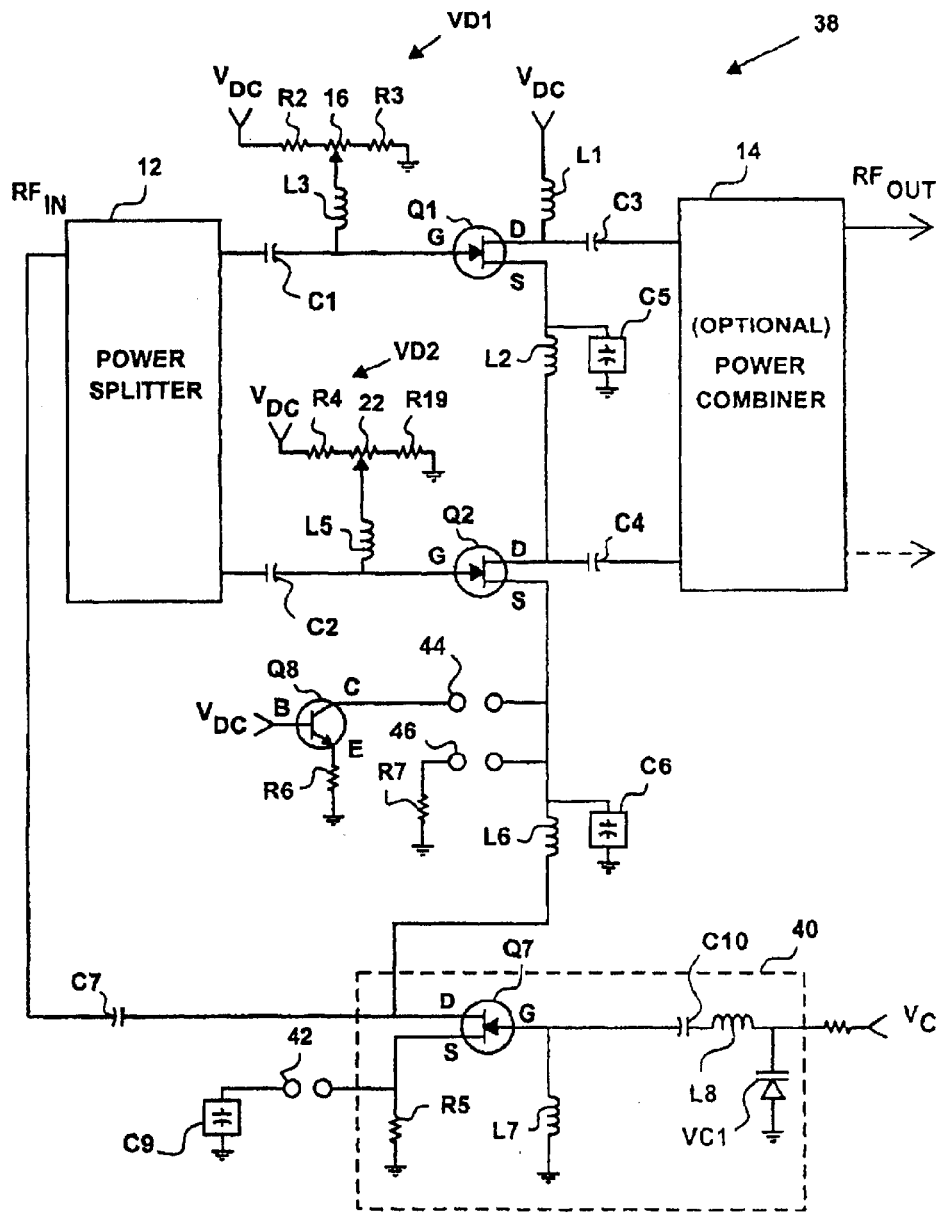
FIG. 5 is an rf power amplifier, or a shared-current electronic system, in which two gallium arsenide FETS are stacked, a third FET is included in the stack as a driver, an rf input is generated by a VCO that controls a gate-source voltage of the driver FET, optionally, amplification is variably controlled by an npn transistor, and a power combiner is optional.

Referring now to FIG. 5, an rf power amplifier, or shared-current electronic system, 38 includes like-named and like-numbered components as those shown in FIG. 4. However, a voltage controlled oscillator, or VCO, 40 includes the driver FET Q7, the resistor R5, the rf choke L7, the coupling capacitor C8, an rf choke L8, and a varactor VC1. The VCO 40 produces an rf output signal that is varied in frequency by changing a control voltage $V_C$ that is applied to the varactor VC1. Optionally, the current drain of the VCO 40 may be increased by connecting jumper terminals 42, thereby connecting the decoupling capacitor C9 between a source terminal of the FET Q7 and the electrical ground to increase the output power of the VCO 40.

If the current drain of the FET Q7 is less than desired for the FETs Q1 and Q2, the current flow may be variably increased by interconnecting a pair of jumper terminals 44, thereby placing the transistor Q8 in parallel with the FET Q7, thereby bypassing currents through a resistor R6 to the electrical ground. Or, by interconnecting a pair of jumper terminals 46, additional current may be bypassed to the electrical ground through the resistor R7.

Figure 6:
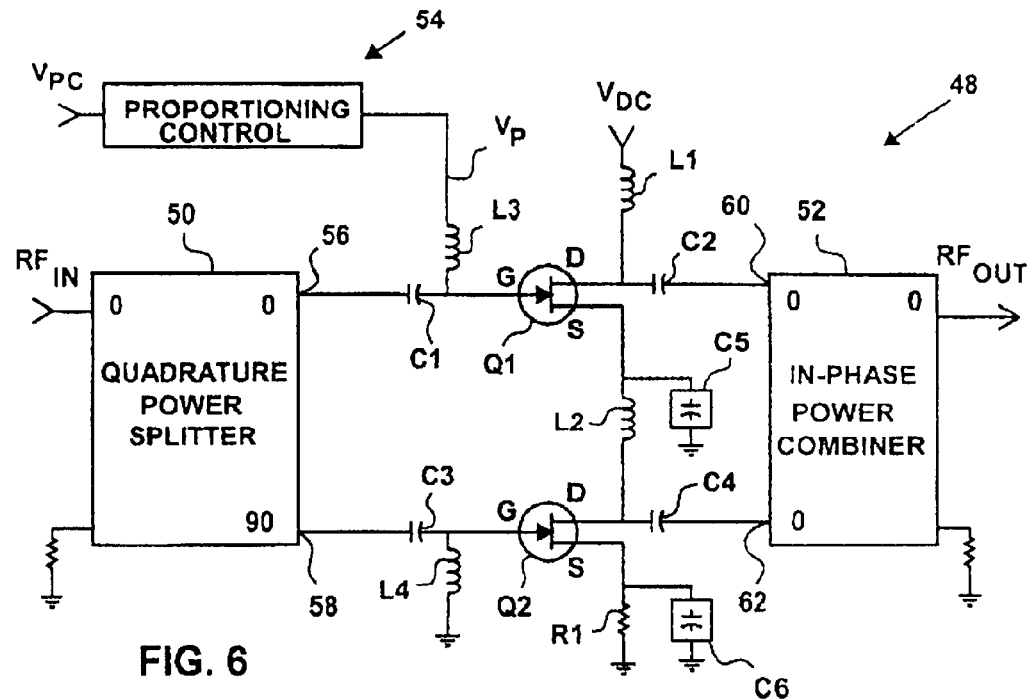
FIG. 6 is a variable phase-shifting rf power amplifier, or a shared-current electronic system, of the present invention in which two, n-channel, gallium arsenide FETs are stacked to selectively utilize a source-voltage, and in which an rf output can be shifted up to 90.0 degrees proportional to, and substantially linearly with, a proportioning-control voltage.

Referring now to FIG. 6, a variable phase-shifting rf power amplifier, or shared-current electronic system, 48 includes solid-state amplifying devices, solid-state electronic devices, field-effect transistors, or FETs, Q1 and Q2, that are connected in series between a higher-voltage, dc source voltage, or supply voltage $V_{DC}$, and a lower voltage, source voltage, or supply voltage, or an electrical ground. That is, the rf choke L1 connects the dc source voltage $V_{DC}$ to the drain terminal of the FET Q1, the rf choke L2 connects the source terminal of the FET Q1 to the drain terminal of the FET Q2, and the resistor R1 connects the source terminal of the FET Q2 to the electrical ground, as described in conjunction with FIG. 1.

The variable phase-shifting rf power amplifier 48 also includes an rf quadrature power splitter 50 and an rf in-phase power combiner 52. The quadrature power splitter 50 is connected to gate terminals of the FETs Q1 and Q2, by the coupling capacitors C1 and C3, respectively. The rf power combiner 52 is connected to the drain terminals of the FETs Q1 and Q2, respectively, by the coupling capacitors C2 and C4. And source terminals of the FETs Q1 and Q2 are connected to an electrical ground by decoupling capacitors C5 and C6, respectively.

A proportioning control 54 provides a proportioning voltage $V_P$ in response to a proportioning control voltage $V_{PC}$, and supplies the proportioning voltage $V_P$ to the gate terminal of the FET Q1 through the rf choke L3 as a variable bias voltage. The resistor R1 supplies a negative gate-to-source bias for the gate terminal of the FET Q2 through the rf choke L4. The resistor R1, in setting the gate-to-source bias for the FET Q2, controls current flow through the FETs, Q1 and Q2, thereby controlling rf power amplification of the variable phase-shifting rf power amplifier 48.

In operation, an rf input $RF_{IN}$ of the variable phase-shifting rf power amplifier 48 is phase split in the rf power splitter 12, into rf signals that are phase shifted by 0 and 90 degrees, are amplified in the FETs Q1 and/or Q2 in selected proportions, and are combined in the rf power combiner 14 to provide a power amplified output at an rf output terminal $RF_{OUT}$ that is selectively phase shifted.

Assuming a 10.0 volt dc source, if the proportioning voltage $V_P$ is lowered to 0.0 volts dc by the proportioning control 54, 10.0 volts dc will be applied across the FET Q1, and 0.0 volts dc will be applied across the FET Q2. Since the gain of FETs, such as the FETs Q1 and Q2, is approximately a linear function of the drain-to-source voltage, an rf output of the FET Q1 will be at maximum gain while an rf output of the FET Q2 will be at minimum gain.

At this time, the in-phase power combiner 52 will output half of the rf power to the rf output terminal $RF_{OUT}$ and half of the rf power to the internal or external load. More importantly, the half delivered to rf output terminal $RF_{OUT}$ will be in-phase with a first rf signal at an upper rf output terminal 56 of the quadrature power splitter 50, that is disregarding inversion of the FET Q1.

If the proportioning voltage $V_P$ is now raised to 10.0 volts dc by the proportioning control 54, 0.0 volts dc will be applied across the FET Q1, and 10.0 volts dc will be applied across the FET Q2. The FET Q1 will now be at a minimum gain, while the FET Q2 will be at maximum gain. In this case, the output of the in-phase rf power combiner 52 will be in-phase with a second rf signal at a lower rf output terminal 58 of the quadrature power splitter 50. That is, the phase will have been shifted 90.0 degrees. Again, half of the power is delivered to the rf output terminal $RF_{OUT}$, and half is delivered to the internal or external load.

If the proportioning voltage $V_P$ is set to 5.0 volts dc by the proportioning control 54, 5.0 volts dc will be applied across both the FET Q1 and the FET Q2, and both FETs will operate at half gain. In this case, an upper rf input terminal 60 and a lower rf input terminal 62 to the rf in-phase power combiner 52 will be equal in amplitude but 90.0 degrees out of phase.

At this time, the rf output terminal $RF_{OUT}$ of the rf in-phase power combiner 52 remains at half power but is 45.0 degrees out of phase with the upper rf input terminal 60. As before, half of the power will be delivered to the internal or external load.

Thus, it can be seen that the proportioning control 54 is effective to shift the phase of the variable phase-shifting rf power amplifier 48, at $RF_{OUT}$, monotonically, and with reasonable linearity, from 0.0 to 90.0 degrees as the proportioning voltage is varied from 0.0 volts dc to 10.0 volts dc.

Finally with regard to FIG. 6, alternately, instead of the quadrature power splitter 50 and the rf in-phase power combiner 52, an in-phase splitter and a quadrature combiner may be used.

Figure 7:
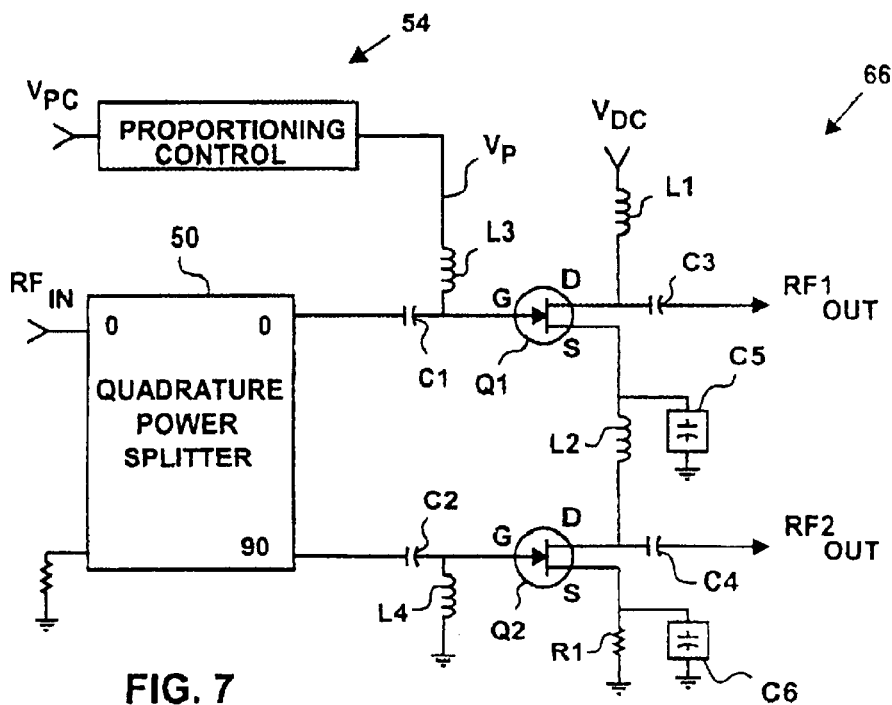
FIG. 7 is a power-shifting rf amplifier, electronic apparatus, or a shared-current electronic system, in which two solid-state electronic devices are connected in series between higher and lower dc source voltages or supply voltages, in which rf signals, which may be in quadrature, are separately amplified in the solid-state electronic devices, and in which the rf power is selectively shifted and proportioned between two separate rf outputs in response to a proportioning-control voltage.

Referring now to FIG. 7, a power-shifting rf amplifier, or shared-current electronic system, 66 includes like-named and like-numbered parts as shown and described in conjunction with FIG. 6, except that the in-phase combiner 52 has been omitted, so the power-shifting rf amplifier 66 has two rf outputs, $RF1_{OUT}$ and $RF2_{OUT}$.

Therefore, operation of the power-shifting rf amplifier 66 is the same as described for the phase-shifting rf amplifier 48 of FIG. 6, except that the rf power is selectively proportioned between the rf outputs, $RF1_{OUT}$ and $RF2_{OUT}$, in response to a proportioning voltage $V_P$ that is generated by the proportioning control 54, instead of being combined into a single, phase-shifted rf output, $RF_{OUT}$, by the in-phase combiner 52 of FIG. 6.

The power-shifting amplifier 66 proportions its rf output between the rf outputs $RF1_{OUT}$ and $RF2_{OUT}$, or shifts the total rf output between the rf outputs $RF1_{OUT}$ and $RF2_{OUT}$, in response to a proportioning voltage $V_P$, and in accordance with both a magnitude of the proportioning voltage $V_P$ and a rate of change thereof. The proportioning voltage $V_P$ is generated and supplied by the proportioning control 54. The proportioning voltage $V_P$, as applied to the gate terminal of the FET Q1, is effective to control gains of both FETs Q1 and Q2 as described in conjunction with the phase-shifting rf amplifier 48 of FIG. 6.

In addition to being able to shift any percentage of the rf output from one rf output, $RF_{OUT}$ or $RF2_{OUT}$, to the other, by varying the proportioning voltage $V_P$ both rapidly and with a sufficient change in the voltage $V_P$, the rf output power can be switched almost instantaneously from one of the rf outputs, $RF1_{OUT}$ or $RF2_{OUT}$, to the other.

The proportioning control 54 of FIGS. 6 and 7 represents any means for providing a variable proportioning voltage $V_P$ for use as variable gate voltages. While the proportioning voltage $V_P$ controls a phase angle of an rf output $RF_{OUT}$ of the phase-shifting rf amplifier 48 of FIG. 6, the proportioning voltage $V_P$ selectively shifts rf output power from the rf output $RF1_{OUT}$ to the rf output $RF2_{OUT}$ of the power-shifting rf amplifier 66 of FIG. 7.

Therefore, it becomes apparent that whereas the rf amplifiers 10, 20, 26, 30, and 38, of FIGS. 1–5, fixedly proportion the dc source voltage between, or among, solid-state electronic devices, the phase-shifting rf amplifier 48 of FIG. 6 and the power-shifting rf amplifier 66 of FIG. 7 both variably proportion the dc source voltages between, or among, the solid-state electronic devices.

Even as the phase-shifting rf amplifier 48 of FIG. 6 maintains substantially constant rf power during phase shifting, the power-shifting rf amplifier 66 of FIG. 7 maintains a total rf output of the two rf outputs, $RF1_{OUT}$ and $RF2_{OUT}$, substantially constant whether the rf output is progressively shifted or switched almost instantaneously.

Since the rf input signal, $RF_{IN}$, has been split by the quadrature power splitter 50, quadrature rf signals are supplied to the gate terminals of the FETs Q1 and Q2, and the rf outputs $RF1_{OUT}$ and $RF2_{OUT}$ are in quadrature. But, if an in-phase splitter is substituted for the quadrature power splitter 50, the two rf outputs $RF1_{OUT}$ and $RF2_{OUT}$ will be in phase.

Figure 8:
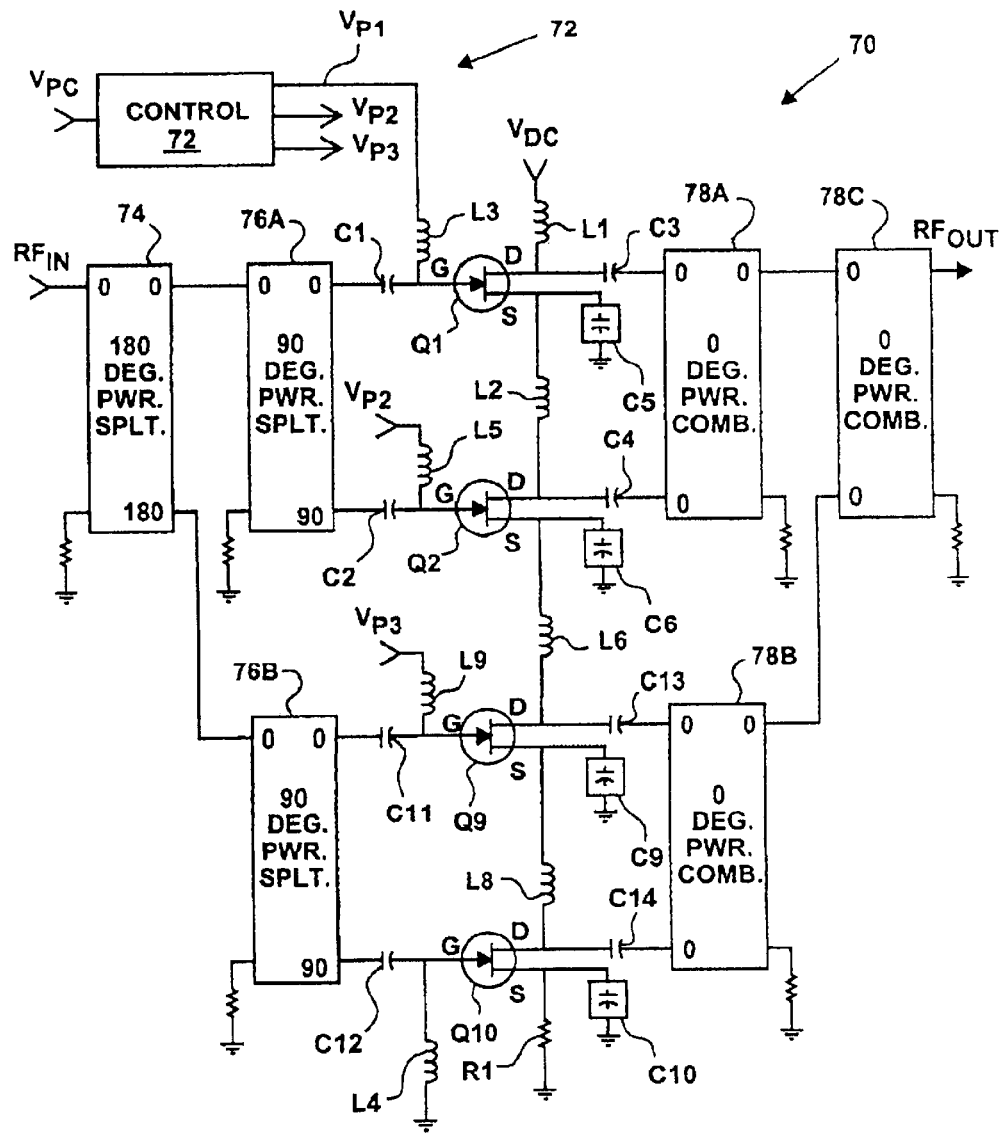
FIG. 8 is a variable phase-shifting rf amplifier, or a shared-current electronic system, in which four FETs are connected in series with a dc source-voltage to utilize the dc source voltage in variably selected proportions, and in which a phase angle of an rf output can be shifted up to 270.0 degrees, proportional to, and substantially linear with, a proportioning-control voltage and three proportioning voltages that are generated by a proportional control of FIG. 11 that is an integral part of the variable phase-shifting rf amplifier of FIG. 8.

Referring now to FIG. 8, a variable phase-shifting rf power amplifier, or shared-current electronic system, 70 has a phase-shift range of 270 degrees, as opposed to 90 degrees for the variable phase-shifting rf power amplifier 48 of FIG. 6. The variable phase-shifting rf power amplifier 70 includes a proportioning control 72 that generates proportioning voltages $V_{P1}$, $V_{P2}$, and $V_{P3}$ in response to a proportioning control voltage $V_{PC}$. Construction of the proportioning control 72 is described in conjunction with FIG. 10.

The variable phase-shifting rf power amplifier 70 includes a 180.0 degree power splitter 74, a 90.0 degree power splitter 76A, a 90.0 degree power splitter 76B, solid-state amplifying devices, solid-state electronic devices, field-effect transistors, or FETs, Q1, Q2, Q9, and Q10, 0.0 degree power combiners 78A, 78B, and 78C. The phase-shifting rf amplifier 70 also includes rf chokes L1, L2, L3, L4, L5, L6, L8, and L9, coupling capacitors C1, C2, C3, C4, C11, C12, C13, and C14, decoupling capacitors C5, C6, C9, and C10, and the resistor R1.

As shown in FIG. 8, the 180 degree power splitter 74 phase splits the rf input $RF_{IN}$ into 0 and 180 degree phase-shifted rf signals, and the 90 degree power splitter 76A, which is connected to the 0 degree output of the 180 degree power splitter 74, splits its output into 0 and 90 degree rf signals, so that 0 and 90 degree phase-shifted rf signals are provided by the 90 degree power splitter 76A at 0 and 90 degree outputs, respectively; and a 180 degree phase-shifted rf signal is provided at the 180 degree output of the 180 degree power splitter 74.

Also, as shown in FIG. 8, the 180 degree output of the 180 degree power splitter 74 is connected to the input of the 90 degree power splitter 76B, so that the output at the 0 degree output of the 90 degree power splitter 76B is not shifted additionally, but remains at 180 degrees. However, the other rf output of the 90 degree power splitter 76B is phase shifted an additional 90 degrees from that of the 180 degree output of the 180 degree power splitter 74, to 270 degrees.

Figure 9:
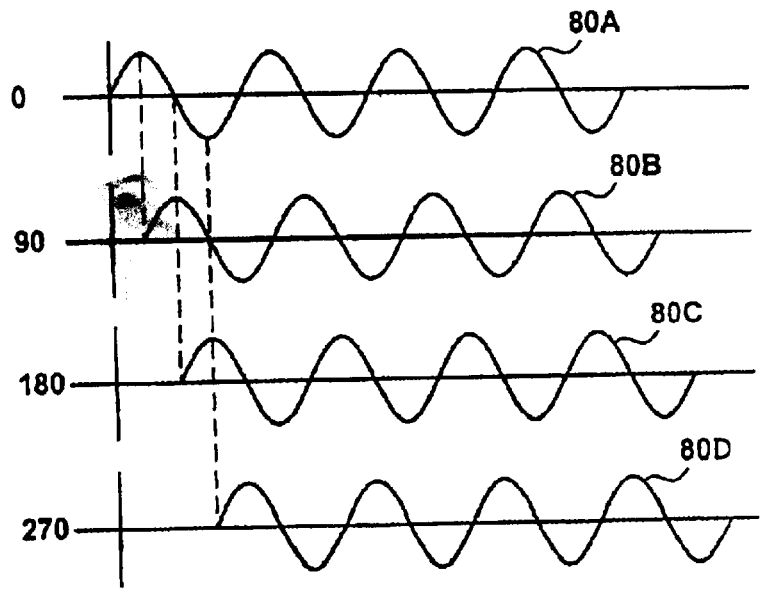
FIG. 9 illustrates sine waves of four phase-split rf signals that are phase-shifted, respectively, by 0.0, 90.0, 180.0, and 270.0 degrees in the phase-shifting rf amplifier of FIG. 8.

Referring now to FIGS. 8 and 9, an rf signal 80A of FIG. 9 that is not phase shifted is provided by the 0 degree output of the 90 degree power splitter 76A, an rf signal 80B that is phase shifted 90 degrees is provided at the 90 degree output of the 90 degree power splitter 76A, an rf signal 80C that is phase shifted by 180 degrees is provided at the 0 degree output of the 90 degree power splitter 76B, and an rf signal 80D that is phase shifted 270 degrees is provided at the 90 degree output of the 90 degree power splitter 76B.

Assuming a 10.0 volts dc source, if proportioning voltages, $V_{P1}$, $V_{P2}$, and $V_{P3}$, are all at 0.0 volts dc, 10.0 volts dc will be applied across the FET Q1, and 0.0 volts dc will be applied across the FETs Q2, Q9, and Q10. Since the gain of the FETs, Q1, Q2, Q9, and Q10 is approximately a linear function of the applied voltage from drain to source, the FET Q1 will be at maximum gain while the FETs Q2, Q9, and Q10 will be at minimum gain. The rf output $RF_{OUT}$ will then be at 0.0 degrees relative to the rf input signal $RF_{IN}$, that is disregarding inversion of the FET Q1.

If the proportioning voltage $V_{P1}$ is now raised to 10.0 volts dc and the proportioning voltages $V_{P2}$ and $V_{P3}$ remain at 0.0 volts dc, 10.0 volts dc will be applied across the FET Q2, and 0.0 volts dc will be applied across the FETs Q1, Q9, and Q10. The FET Q2 will now be at maximum gain while the FETs Q1, Q9, and Q10 will be at minimum gain. In this case, the rf output $RF_{OUT}$ will be at 90.0 degrees relative to the rf input signal $RF_{IN}$, again disregarding inversion of the FET Q2.

Similarly, if the proportioning voltage $V_{P1}$, is at 5.0 volts dc, and the proportioning voltages $V_{P2}$ and $V_{P3}$ are at 0.0 volts dc, the rf output $RF_{OUT}$ will be at 45.0 degrees relative to the rf input signal $RF_{IN}$. By properly selecting the proportioning voltages $V_{P1}$, $V_{P2}$, and $V_{P3}$, the phase of the phase-shifting rf power amplifier 70 can be made to vary monotonically and reasonably linearly from 0.0 degrees to 270.0 degrees. Optionally, the splitters and combiners can be at phase angles other than 0.0 degrees, 90.0 degrees, and 180.0 degrees.

Figure 10:
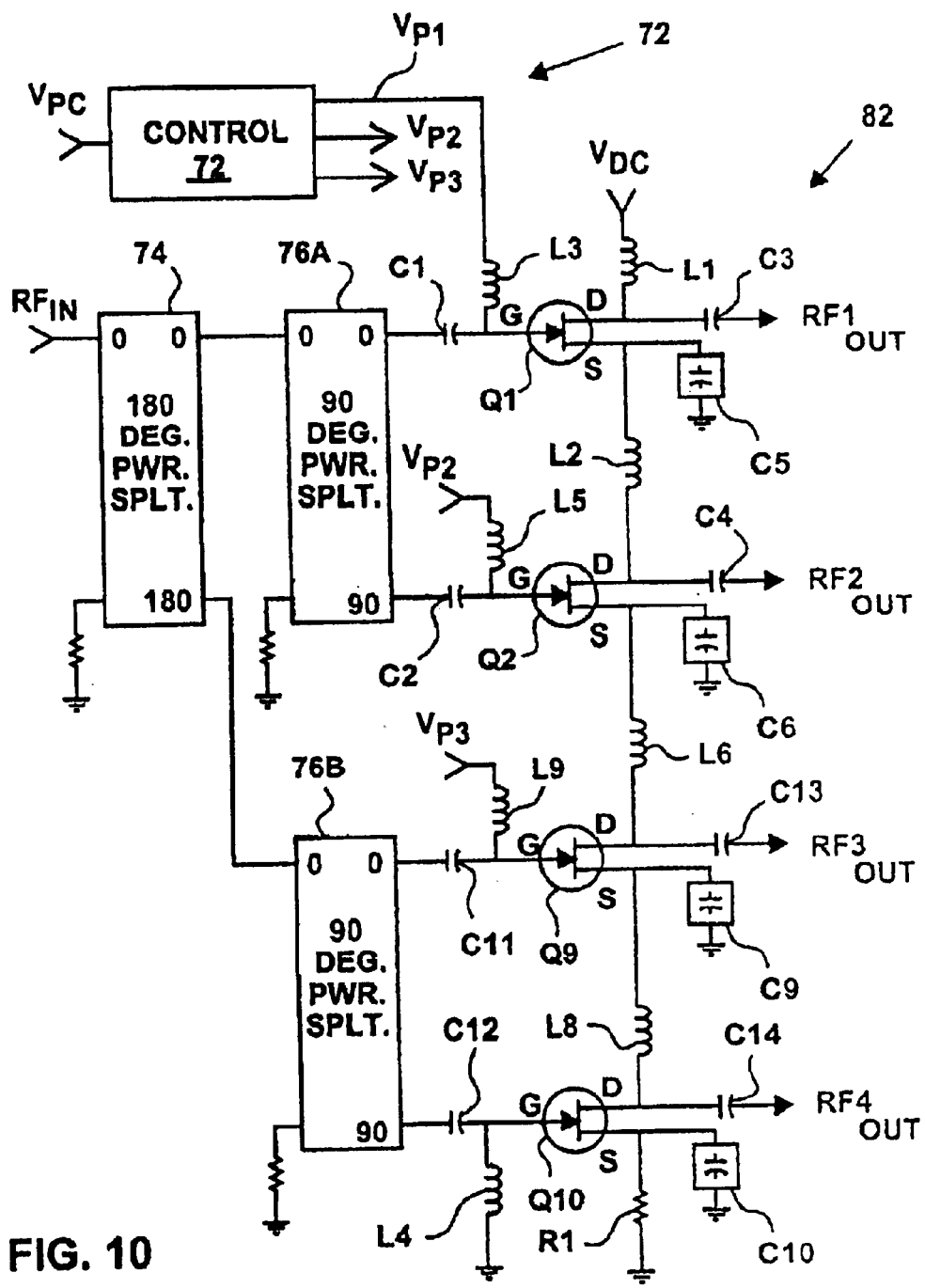
FIG. 10 is a variable power-shifting rf amplifier, or power-switching amplifier, in which four solid-state electronic devices are connected in series between higher and lower dc source voltages or supply voltages to utilize the dc source voltage in variably selected proportions, in which 0, 90, 180, and 270 degree rf signals are separately amplified in the four solid-state electronic devices, and the rf power is selectively proportioned, or selectively switched, among four rf outputs in response to the three proportioning voltages that are generated by the proportioning control, of FIG. 11, that is an integral part of the power-shifting rf amplifier of FIG. 10.

Referring now to FIG. 10, a variable power-shifting rf amplifier, or power-switching amplifier, 82 includes like-named and like-numbered parts as shown and described in conjunction with the phase-shifting rf amplifier 70 of FIG. 8, including the proportioning control 72, except that the power combiners 78A, 78B, and 78C have been omitted, thereby providing four rf outputs, $RF1_{OUT}$, $RF2_{OUT}$, $RF3_{OUT}$, and $RF4_{OUT}$.

The power-shifting rf amplifier 82 will selectively and progressively shift, or abruptly switch, power between/ among the rf power outputs $RF1_{OUT}$, $RF2_{OUT}$, $RF3_{OUT}$, and $RF4_{OUT}$ in response to proportioning voltages $V_{P1}$, $V_{P2}$, and $V_{P3}$.

The proportioning control 72 produces the proportioning voltages $V_{P1}$, $V_{P2}$, and $V_{P3}$ in response to the proportioning control voltage $V_{PC}$. The rf output $RF2_{OUT}$ is at 90 degrees to the rf output $RF1_{OUT}$, the rf output $RF3_{OUT}$ is at 180 degrees to the rf output $RF1_{OUT}$, and the rf output $RF4_{OUT}$ is at 270 degrees to the rf output $RF1_{OUT}$.

Figure 11:
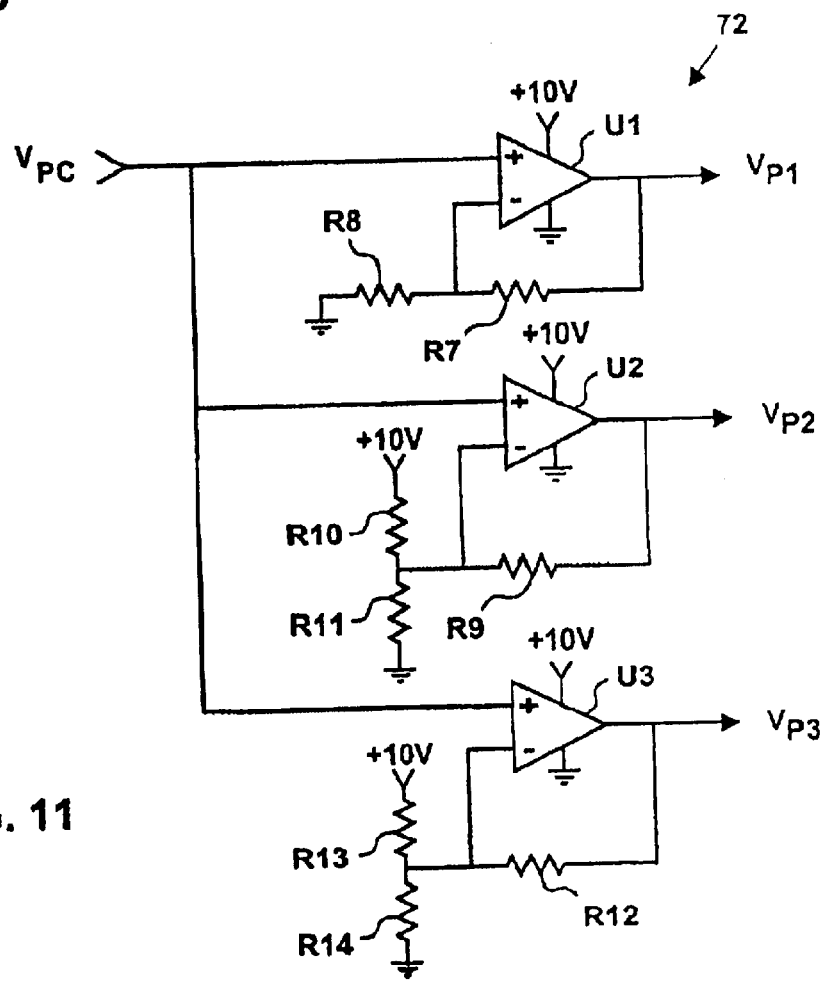
FIG. 11 is the proportioning control that is an integral part of both the variable phase-shifting rf power amplifier of FIG. 8 and the power-shifting rf amplifier of FIG. 10, and that generates the three proportioning voltages, in response to a proportioning-control voltage, for controlling both the phase-shifting rf amplifier of FIG. 8 and the power-shifting rf amplifier of FIG. 10.

Referring now to FIG. 11, the proportioning control 72, which is included in the embodiments of FIGS. 8 and 10, includes amplifiers U1, U2, and U3 which are rail-to-rail operational amplifiers. In addition, the proportioning control 72 includes resistors R7, R8, R9, R10, R11, R12, R13, and R14 that set the gain of the amplifiers, U1, U2, and U3, to be 4.0. Resistances of the resistors R7, R8, R9, R10, R11, R12, R13, and 14 preferably are 30K, 10K, 30K, 30K, 15K, 30K, 15K and 30K, respectively, but all may be at resistances that are any reasonable multiple or fraction thereof.

Assuming a 10.0 volts dc source, the amplifiers, U1, U2, and U3, are biased to start amplifying at proportioning voltages $V_P$ of 0.0, 2.5, 5.0, 7.5, and 10.0 volts respectively.

In response to a proportioning-control voltage $V_{PC}$ of 0.0 volts, the proportioning control 72 produces proportioning voltages, $V_{P1}$, $V_{P2}$, and $V_{P3}$, of 0.0 volts dc. In response to increases in the proportioning-control voltage $V_{PC}$, the proportioning voltage $V_{P1}$ increases to 10.0 volts while keeping the proportioning voltages $V_{P2}$ and $V_{P3}$ at 0.0 volts dc.

With further increases in the proportioning control voltage $V_{PC}$, when the proportioning voltage $V_{P1}$, reaches 10.0 volts dc, it remains at this level, while the proportioning voltage $V_{P2}$ increases from 0.0 volts to 10.0 volts dc. In like manner, after the proportioning voltages, $V_{P1}$, and $V_{P2}$, both reach 10.0 volts dc, they remain at 10.0 volts dc while additional increases in the proportioning control voltage $V_{PC}$ increase the proportioning voltage $V_{P3}$ from 0.0 to 10.0 volts dc.

Although a detailed construction has been shown and described, the proportioning control 72 is representative of any device, analog or digital, that will produce the proportioning voltages $V_{P1}$, $V_{P2}$, and $V_{P3}$ in response to an analog or digital input, vary the proportioning voltages $V_{P1}$, $V_{P2}$, and $V_{P3}$ in whatever manner is useful for a particular application, and vary them in whatever time frame may be desirable or suitable for an intended use in either the phase-shifting rf amplifier 70 of FIG. 8 or the power-shifting rf amplifier 82 of FIG. 10.

Gains of the FETs Q1, Q2, Q9, and Q10 are selectively varied by varying the proportioning voltages $V_{P1}$, $V_{P2}$, and $V_{P3}$, and applying them to the gates of the FETs Q1, Q2, and Q9. As the proportioning voltages $V_{P1}$, $V_{P2}$, and $V_{P3}$ are selectively varied, the rf output is selectively shifted/ proportioned among rf outputs $RF1_{OUT}$, $RF2_{OUT}$, $RF3_{OUT}$, and $RF4_{OUT}$.

Thus it can be seen that the phase-shifting rf amplifier 48, the phase-shifting rf amplifier 70, the power-shifting rf amplifier 66, and the power-shifting rf amplifier 82 all selectively proportion the dc source voltage between, or among, solid-state electronic devices, whether they be J-FETs, such as GaAsFETs, MOSFETs, bipolar-junction transistors, or any other electronic device.

Figure 12:
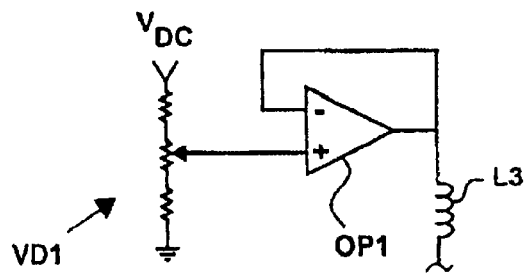
FIG. 12 illustrates an operational amplifier being used as a buffer to prevent current-caused changes in a bias voltage for the shared-current electronic systems of FIGS. 1–5, and 16–21.

Referring now to FIG. 12, an operational amplifier OP1, that is configured as a buffer, has been inserted between the variable voltage divider VD1 and the rf choke L3. Preferably, the operational amplifier OP1 is used in conjunction with the variable voltage divider VD1 in FIGS. 1–5 and 16–21. Also, preferably, the operational amplifier OP1 is used in conjunction with the variable voltage divider VD2 of FIGS. 2–5, being interposed between the potentiometer 22 and the rf choke L5.

If the gate current of the FET Q1 changes when the amplifier is tuned across a frequency band or operated over varying environmental conditions, the operational amplifier OP1 prevents varying gate current from affecting the variable voltage divider VD1 and, therefore, the bias of both FETs, Q1 and Q2.

Figure 13:
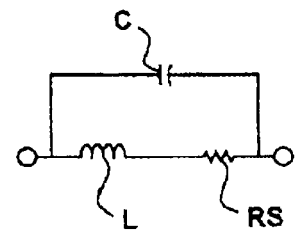
FIG. 13 is a model for simulating a microwave inductor.

Referring now to FIG. 13, the microwave circuit model of an inductor is a series resistor RS and inductor L in parallel with a capacitor C. The resistor RS represents the dc coil resistance along with the increased wire resistance at rf frequencies due to the skin effect (the effect of the current being concentrated nearer to the surface of the wire) as the operational frequency is increased. The capacitor C represents the distributed capacitance between the parallel windings of the coils. Inductance of the inductor L is the nominal component inductance.

At operation below the self-resonant frequency, the impedance of an inductor increases as frequency increases. At the inductor self-resonant frequency, the inductor, as represented by the parallel UC circuit of FIG. 13, resonates as an open circuit creating a maximum impedance to the rf signal. At operation higher than the self-resonant frequency, the distributed capacitance of the capacitor C dominates the rf impedance resulting in the impedance decreasing with increasing frequency. The inductor self-resonant frequency is $F_{SR}=1/[2\pi*\sqrt{(LC)}]$.

A resistance of the series resistor RS limits the maximum impedance of the self-resonant inductor. That is, the quality factor (Q) of the inductor is the ratio of an inductor's reactance to the resistance of the series resistor RS. High-Q inductors, with very low resistances, have very high self-resonant impedances, but for only a narrow bandwidth. Lower-Q inductors, with higher resistances, have lower self-resonant impedances for a much broader bandwidth.

This self-resonant feature is used in the circuit to prevent the rf signal from coupling onto the dc bias lines and to aid the decoupling capacitors in preventing rf crosstalk between the two, or more, FETs. For narrow-band operation, very high-Q inductors are desired to maximize series impedance. Quarter wave transformers may also be used for this function in narrow-band applications. For broad-band operation, lower-Q inductors are desired to obtain a high impedance across a larger bandwidth. In either application, the inductor must be capable of passing the maximum dc current without breakdown.

In addition, utilizing the self-resonant characteristics of decoupling capacitors, such as the decoupling capacitors C5, C6, C9, and C10, is required to optimize rf performance while maximizing dc-rf conversion efficiency in all applications, except where the rf power is minimal.

Referring now to FIG. 14, the microwave circuit model of a capacitor is an inductor L in series with a resistor RS in series with a capacitor C. The inductor L represents the inductance of the leads and the capacitor plates. The resistor RS represents the equivalent series resistance, or ESR, of the capacitor. Capacitor dielectric losses, metal plate losses, and skin effects all contribute to the ESR. The capacitor C is the nominal component capacitance.

These parasitic effects of a capacitor at microwave frequencies alter its impedance characteristics in the opposite manner as that of an inductor. At operation below the self-resonant frequency, a capacitor decreases in impedance as frequency increases. At the capacitor self-resonant frequency, a capacitor, as represented by the series L/C circuit of FIG. 14, resonates as a short circuit, creating a minimum impedance to the rf signal. At frequencies higher than the self-resonant frequency, the lead and plate inductance L dominates the rf impedance, resulting in the impedance increasing with increasing frequency. The capacitor self-resonant frequency equation is $F_{SR}=1/[2\pi*\sqrt{(LC)}]$, which is the same as for the inductor.

The rf impedance of a capacitor at self-resonant frequency is equal to the effective series resistance (ESR). As in the case of the inductor, the quality factor Q of a capacitor is the ratio of the capacitor's reactance to its ESR, or alternately the quality factor Q is 1/DF, where DF is the dissipation factor of the capacitor. High-Q capacitors, with very low ESR, have very low self-resonant impedances, but for only a narrow bandwidth. Lower-Q capacitors, with higher ESR, have lower self-resonant impedances for a much broader bandwidth. Presently, the preferred capacitor dielectric to minimize capacitor ESR is porcelain. Porcelain has a dissipation factor, DF, of 0.00007, the lowest of all currently available capacitor dielectrics.

The power dissipated in the decoupling capacitor is $P_{DISS}=I^2*ESR$, where I is the root-mean-square, or rms, of the rf current through the capacitor. Alternately, $P_{DISS}=P_{RF}*ESR/Z$, where Z is the circuit load impedance, typically 50.0 ohms, and $P_{RF}$ is the rf output power of the FET.

For optimal performance, the ratio of FET rf output power, $P_{RF}$, to decoupling capacitor power dissipated, $P_{DISS}$, should be no less than 2000.0 for medium rf power, which is defined as 100.0 milliwatts to two watts FET rf output power. For high power rf applications, which is defined as FET output power greater than 2.0 watts, the $P_{RF}/P_{DISS}$ ratio should be no less than 5000.0.

Very high-Q decoupling capacitors are necessary to minimize series impedance to a circuit ground, whether it be for narrow-band, or wide-band, operation. Even for narrow-band operation, paralleled capacitors are necessary to achieve an ESR that is sufficiently low, except for very low rf output. For broad-band operation, multiple high-Q decoupling capacitors with self-resonant frequencies selected at several points in the operating frequency band are selected to achieve a low ESR across a broad frequency band.

Packaged GaAsFETs typically have a considerable source lead parasitic inductance. By choosing a decoupling capacitor, or capacitors, with a value that resonates with the source lead inductance, the true FET source impedance to a circuit ground is further reduced.

Therefore, the package, or lead, inductance of the capacitor, or capacitors, should be considered in the equation for resonance when selecting a capacitor to resonate with the GaAsFET source lead inductance. Additionally, several parallel capacitors, with a combined reactance that resonates with the GaAsFET source lead inductance, are selected to minimize the decoupling capacitor ESR and maximize efficiency, as discussed below.

For both narrow-band and broad-band operation, the ESR of the decoupling capacitance should be less than 0.2 ohms divided by the square root of the rf output in watts. And the ESR becomes increasingly more critical as the output power increases. For narrow-band operation, the ESR values taught herein should be followed whenever $\sqrt{(P_{RF} \cdot f)}$ is greater than 2.5. For wide-band operation, the ESR values taught herein should be followed whenever $\sqrt{(P_{RF} \cdot f)} + \sqrt{(P_{RF})} \cdot \Delta f/100$ is greater than 2.5.

Referring now to FIG. 15, a low ESR capacitor assembly 86 includes two or more multiple porcelain dielectric capacitors Ca-n. Paralleling a plurality of capacitors at the self-resonant frequency divides the ESR in the same manner as paralleling resistors.

One or more of the low ESR capacitor assemblies 86 is/are used in each of the current-sharing electronic systems that are taught herein, whenever the formulas taught above show the need for an ESR lower than that of a single capacitor. Therefore, if a drawing shows decoupling capacitors such as C5 and C6, it should be understood that the capacitor assembly 86 is to be used when it is necessary to lower the ESR.

For narrow-band operation, two or more capacitors Ca-n, each having a self-resonant frequency at or near an amplifier operating frequency, are connected in parallel in the low ESR capacitor assembly, as shown in FIG. 15. If a capacitor Ca-n is not available with self-resonating frequencies at the amplifier operating frequency, then one capacitor Ca-n is selected that resonates at a frequency that is higher than the amplifier operating frequency, and one capacitor Ca-n is chosen that resonates at a frequency that is lower than the amplifier operating frequency.

For broad-band operation, the low ESR capacitor assembly 86 includes two or more capacitors Ca-n with spaced-apart self-resonating frequencies. As bandwidth increases, often it is desirable to use pairs of the capacitors Ca-n, with each pair self-resonating at various frequencies across the bandwith.

Porcelain capacitors presently have the lowest dielectric resistance and are preferred for minimizing the effective rf impedance. Porcelain capacitors, series 600S, manufactured by American Technical Ceramics of Huntington Station, N.Y., are suitable for rf decoupling as taught herein.

Series 600S capacitors that are available from *American Technical Ceramics*, their self-resonant frequencies, their capacities, and their effective series resistances, are included in the following table.

TABLE 1

Porcelain Capacitors
Self Resonant Frequencies vs. ESRs

| Self Resonant Freq. | Capacitance | ESR |
|---|---|---|
| 1.0 GHz | 100.0 pF | 0.07 ohms |
| 2.0 GHz | 40.0 pF | 0.09 ohms |
| 4.0 GHz | 15.0 pF | 0.15 ohms |
| 8.0 GHz | 3.0 pF | 0.20 ohms |
| 16.0 GHz | 1.0 pF | 0.30 ohms |

Referring now to FIG. 15 and Table 1, as an example of capacitor paralleling to achieve a required ESR, assume a narrow-band amplifier having an operating frequency at 4.0 GHz and having an rf output of 5.0 watts. As taught above, the ESR is critical if the square root of the product of the output power and the operating frequency in gigahertz is greater than 2.5. With 4.0 GHz and 5.0 watts, the result is 4.72, which is considerably greater than the 2.5 limit, so the ESR of an rf decoupling capacitor is critical.

Since, as shown above, the ESR of the decoupling capacitance should be less than 0.2 ohms divided by the square root of the rf output in watts, we calculate that the required maximum ESR is 0.089 ohms. With our assumed operating frequency of 4.0 GHz from Table 1, the ESR for a porcelain capacitor that resonates at 4.0 GHz is 0.15 ohms, so two capacitors must be paralleled to reduce the ESR to the required maximum.

Figure 16:
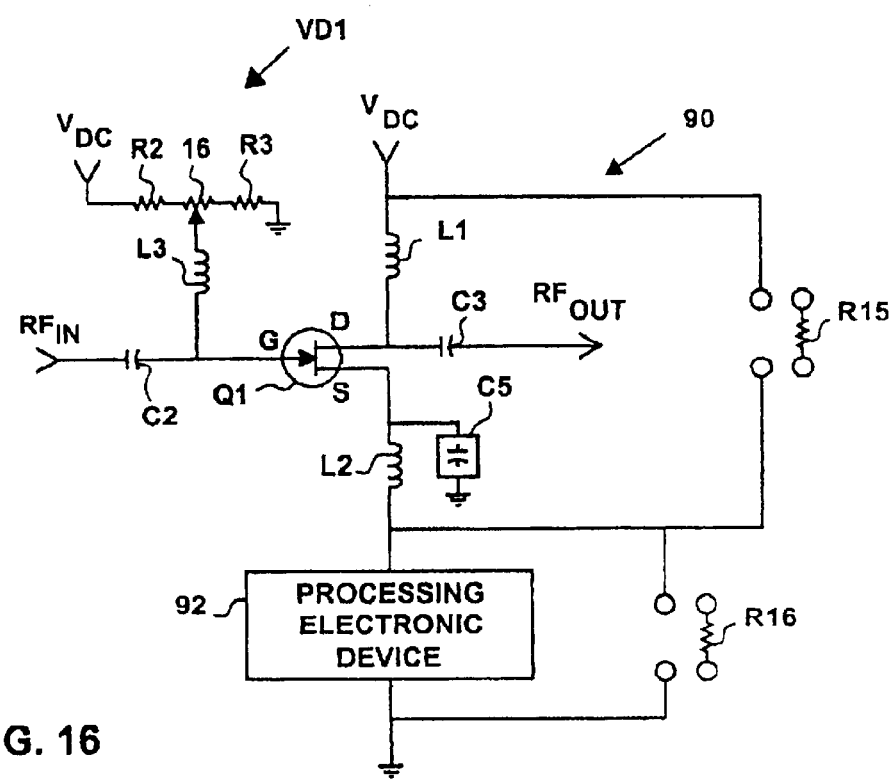
FIG. 16 is a shared-current electronic system in which an n-channel GaAsFET is connected in dc series with a processing electronic device.

Referring now to FIG. 16, a shared-current electronic system, 90 includes like-named and like-numbered parts as those of FIG. 1, except that the GaAsFET Q2, with its associated parts, is omitted, and the GaAsFET Q1 is connected in series with a processing electronic device, or baseband processing device, 92, between the dc supply voltage $V_{DC}$ and a ground.

The processing electronic device 92 may be any collection or assembly of electronic devices that provides a desired electronic function. While no input or output communication has been shown between the GaAsFET Q1 and the processing electronic device 92, any suitable connections may be made, to provide any suitable relationship therebetween.

Additional components of the shared-current electronic system 90 are the same as shown and described in conjunction with FIG. 1, except that the power splitter 12 has been omitted, the power combiner 14 has been omitted, and shunt resistors R15 and R16 have been added.

If a current flow requirement for the processing electronic device 92 is greater than that of the GaAsFET Q1, then the resistor R15 can be connected to shunt current around the GaAsFET Q1. Or, if the current flow requirement for the GaAsFET Q1 is greater than that of the processing electronic device 92, then the resistor R16 can be connected to shunt current flow around the processing electronic device 92.

Figure 17:
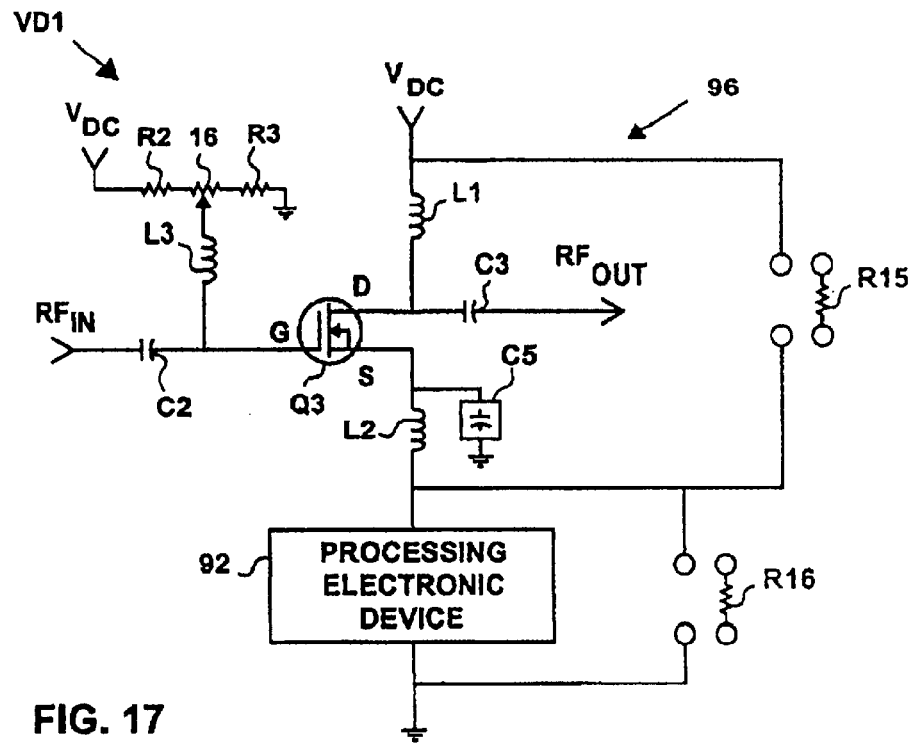
FIG. 17 is a shared-current electronic system of the present invention in which an n-channel MOSFET is connected in dc series with the processing electronic device of FIG. 16.

Referring now to FIG. 17, a shared-current electronic system 96 includes like-named and like-numbered parts as those of FIG. 16, except that the GaAsFET Q1 has been replaced by the MOSFET Q3, which is connected in series with the processing electronic device 92, between a dc supply voltage $V_{DC}$ and a ground. Operation is as described for FIGS. 1, 2, and 16.

Figure 18:
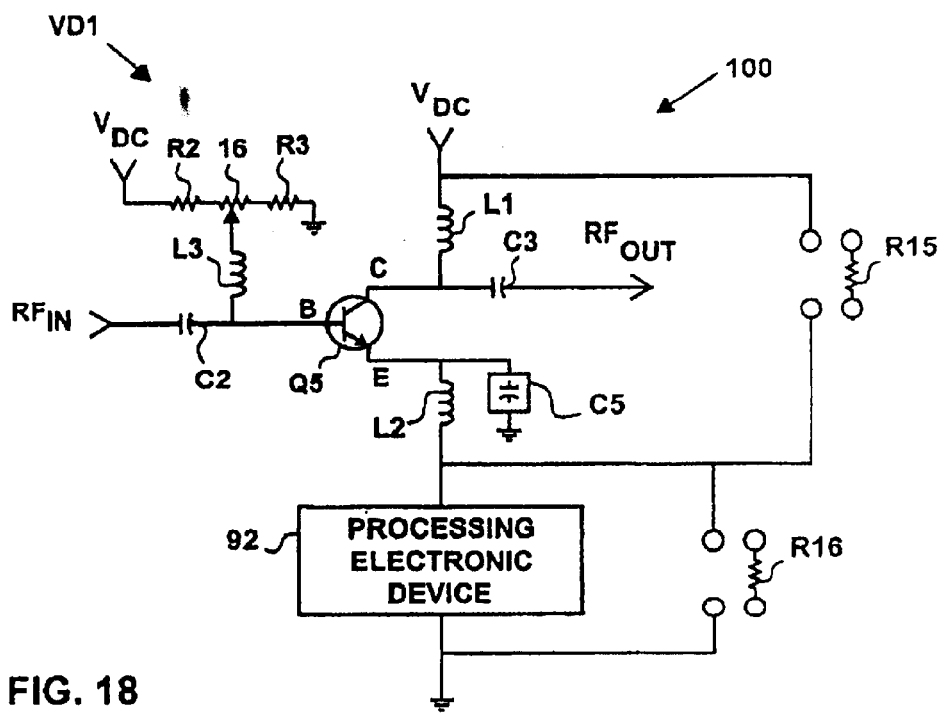
FIG. 18 is a shared-current electronic system in which an npn bipolar-junction transistor is connected in dc series with the processing electronic device of FIGS. 16 and 17.

Referring now to FIG. 18, a shared-current electronic system 100 includes like-named and like-numbered parts as those of FIG. 16, except that the GaAsFET Q1 has been replaced by the bipolar-junction transistor Q5, which is connected in series with the processing electronic device 92, between a dc supply voltage $V_{DC}$ and a ground. Operation is as described for FIGS. 1, 2, 16, and 17.

Figure 20:
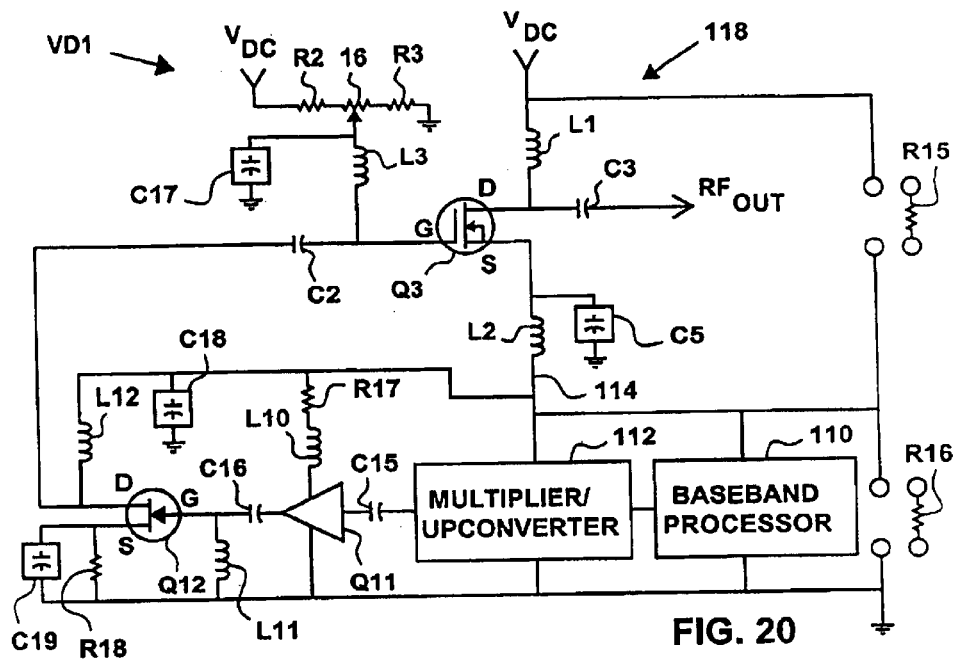
FIG. 20 is a frequency-compression electronic system, or a shared-current electronic system, in which the rf output GaAsFET of FIG. 19 is replaced by a MOSFET.
Figure 21:
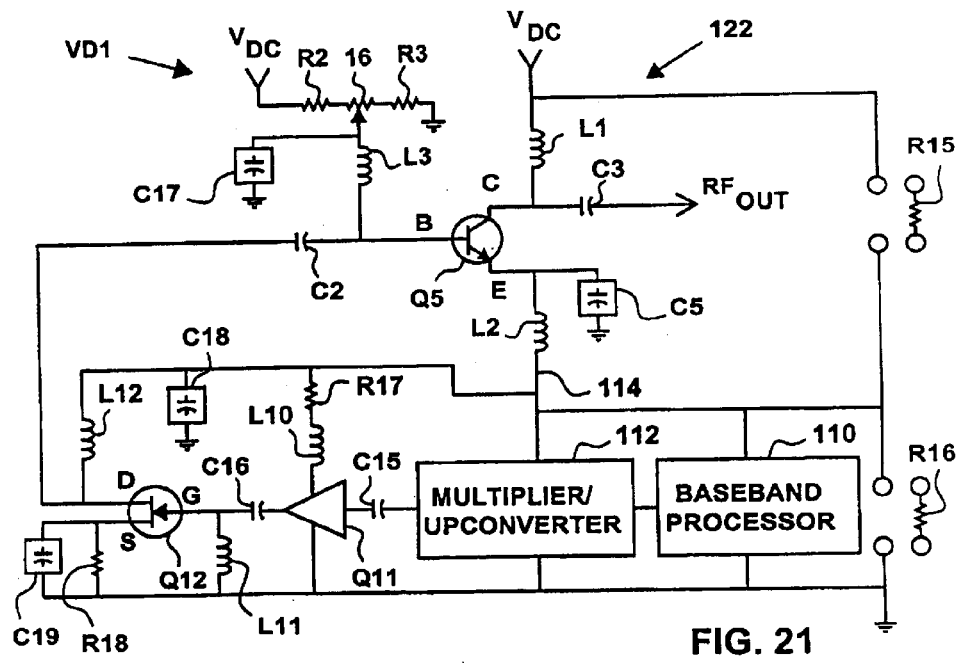
FIG. 21 is a frequency-compression electronic system, or a shared-current electronic system, in which the rf output GaAsFET of FIG. 19 is replaced by a bipolar-junction transistor.

FIGS. 19–21 are spectrally efficient digital modulation systems that utilize the shared-current principle of the present patent application. Various spectrally efficient digital modulations systems have been developed for the purpose of transmitting more data in a given bandwidth. Among the various modulation systems are the PCM/FM waveform (Tier 0), the shaped-offset QPSK waveform (SOQPSK, Tier I) which doubles the quantity of data that can be transmitted in a given bandwidth, and the multi-h CPM waveform (Tier II) that compresses three times more data in a given bandwidth than the PCM/FM waveform. While the multi-h CPM waveform excels in spectral efficiency, the demodulator is extremely complex and expensive.

While the frequency-compression systems of FIGS. 19–21, and the current-sharing principles thereof, will generate PCM/FM and multi-h CPM waveforms with suitable software, the emphasis herein is on SOQPSK waveforms which provide outstanding gains in spectral efficiency without the complexity and expense that is associated with demodulating the multi-h CPM waveform.

The SOQPSK waveform was invented by Terrance J. Hill. He taught this waveform in his article entitled: *An Enhanced, Constant Envelope, Interoperable Shaped Offset QPSK (SOQPSK) Waveform for Improved Spectral Efficiency*, published in the Proceedings of the International Telemetering Conference in San Diego, Calif. on October 2000.

As noted above, SOQPSK is a high spectral efficiency method of modulation that compresses more data into a given bandwidth than conventional methods of modulation. Unfortunately, from a power-consumption standpoint, it is highly inefficient. However, power efficiency is increased tremendously by sharing current of the SOQPSK components with the GaAsFET Q1 that produces the rf output. The power efficiency is further improved by sharing the current flow of the GaAsFET Q1 with a gain block Q11. The gain bock Q11, is a solid-state amplifying device, or solid state electronic device.

In a typical 5.0 watt SOQPSK system, it takes 1.2 amperes at 6.5 volts to generate a bandwidth compressed carrier at a center frequency, and the final 5 watt amplifier draws about 1.5 amperes from a 12 volt dc supply. In prior art SOQPSK systems, operating voltages for both generation of the SOQPSK carrier and the final amplifier are separately provided from an 18.5 volts dc source through linear regulators, thereby resulting in a large percentage of power being lost in voltage regulation. In contrast, the SOQPSK systems of the present invention share the current for both bandwidth generation and final amplification, so much higher overall efficiency is achieved.

Referring now to FIG. 19, a SOQPSK system, or shared-current electronic system, 108, includes a baseband processor, baseband processing device, or processing electronic device, 110, a multiplier/up-converter, or processing electronic device, 112 and two solid-state amplifying devices, or solid-state electronic devices, Q11 and Q12 that are connected in dc parallel with each other, so that the total current used by these four electronic devices flows through a conductor 114. The electronic device Q11 is a gain block (a chip that includes two bipolar-junction transistors), and the electronic device Q12 is a GaAsFET that is used as a driver for the FET Q1. Both electronic devices, Q11 and Q12, provide preamplification for the FET Q1. While the gain block Q11 and the GaAsFET Q12 have been shown, any mixture of solid-state devices, such as gain blocks, BJTs, J-FETs, or MOSFETs, can be used for preamplification, as long as proper bias is provided.

In addition to the variable voltage divider VD1, the GaAsFET Q1, the coupling capacitors C1 and C3, the decoupling capacitor C5, and the rf chokes L1, L2, and L3 of FIG. 1, the spectrally efficient system 108 also includes the baseband processor 110, the multiplier/upconverter 112, the gain block Q11, the driver GaAsFET Q12, resistors R15, R16, R17, and R18, rf chokes L10, L11, and L12, coupling capacitors C15 and C16, decoupling capacitors C17, C18, and C19, and the conductor 114.

Not only are the baseband processor 110, the multiplier/up-converter 112, the gain block Q11, and the GaAsFET Q12 all in dc parallel, they are also all in dc series with the FET Q1. Therefore, the baseband processor 110, the multiplier/up-converter 112, the gain block Q11, and the GaAsFET Q12 all share current to the GaAsFET Q1 through the conductor 114, thereby greatly increasing the overall power efficiency of the SOQPSK system 108.

If the GaAsFET Q1 requires less current than the total current flow of the components that are below the conductor 114, then the shunt resistor R15 can be used to increase current flow for the components below the conductor 114. Or, if the GaAsFET Q1 requires more current than the total current flow of all of the components that are below the conductor 114, then the shunt resistor R16 can be used to increase current flow for the FET Q1.

The baseband processor 110 uses a frequency command and a modulation input to create a SOQPSK modulated rf signal at about 70 MHz. The multiplier/upconverter 112 multiplies and then upconverts (mixes) the 70.0 MHz signal to L-band or S-band (1430.0–1540.0 MHz or 2200.0–2400.0 MHz). The drivers, consisting of the gain block Q11 and the driver GaAsFET Q12, amplify the L-band or S-band signal to a level adequate to drive the GaAsFET Q1.

Referring now to FIG. 20, a spectrally efficient system, electronic apparatus, or a shared-current electronic system, 118 includes the MOSFET Q3 that is connected in dc series with the baseband processor 110 and the multiplier/up-converter 112 of FIG. 19.

Except for replacing the GaAsFET Q1 of FIG. 19 with the MOSFET Q3 of FIG. 20, and except for changes relating to providing bias for the MOSFET Q3, the systems, 108 and 118, are the same. Therefore, operation of the spectrally efficient system 118 can be understood by reading the description of the spectrally efficient system 108 of FIG. 19.

As taught in conjunction with FIGS. 1 and 15, capacitances of decoupling capacitors, such as the decoupling capacitors C5, C17, C18, and C19, should have effective series resistances (ESRs) as taught herein whenever rf outputs exceed limits as taught herein.

Referring now to FIG. 21, a spectrally efficient system, SOQPSK spectrally efficient system, or a shared-current electronic system, 122 includes components as shown and described in conjunction with FIG. 19, except that the GaAsFET Q1 of FIG. 19 has been replaced with the bipolar-junction transistor Q5.

Referring finally to FIGS. 19, 20, and 21, and considering the number and types of electronic devices, 110, 112, Q11, and Q12, that are connected in dc parallel to each other and in series with the output power device, the GaAsFET Q1, the MOSFET Q3, or the bipolar-junction transistor Q5, it can be understood that once the source of the FET, Q1 or Q3, or the emitter of the bipolar-junction transistor Q5 is decoupled, anything that involves rf signals of the same frequency, or different frequencies, can be connected in series with the GaAsFET Q1, the MOSFET Q3, or the bipolar-junction transistor Q5, provided that the decoupling and rf choking network works for all frequencies in the system.

It follows that, although one solid-state electronic device, such as the GaAsFET Q1, has been shown with at least one processing electronic device, such as the baseband processor 110, with the solid-state electronic device nearest to the dc source voltage, the stack could be inverted with the processing electronic device nearest to the dc source voltage.

In summary, the present invention can be characterized as providing apparatus both constant and variable power, in which at least one solid-state electronic device and at least one other electronic device, whether a solid-state electronic device or a processing electronic device, fixedly or dividingly share the supply voltage and share the same current, and in which a single rf output, or a plurality of rf outputs, are produced.

Further, the present invention can be characterized as providing apparatus in which two or more rf outputs may be variably phase shifted, in which the total rf output may be variably shifted between/among a plurality of rf outputs, or in which the total rf power may be switched between/among a plurality of rf outputs, all without substantially varying the total rf power, and bandwidth compression is achieved with improved power efficiency.

The present invention also can be characterized as connecting a plurality of electronic devices, such as solid-state electronic devices or processing electronic devices, in dc series, operating the electronic devices in either series or parallel for rf operation, and minimizing interference between the electronic devices by providing a new and unique method of rf decoupling.

As can be seen in FIG. 8, two solid-state electronic devices, such as the FETs Q2 and Q9, are connected in dc series between the source voltage $V_{DC}$ and an electrical ground, even though one is connected indirectly to the source voltage $V_{DC}$ and the other is connected indirectly to the electrical ground. Further, as can be seen in FIG. 2, one solid-state electronic device, such as the FET Q3, is connected to a higher dc voltage, and an other solid-state electronic device, such as the FET Q4, is connected to a lower dc voltage, even though the FET Q3 is connected directly to the source voltage $V_{DC}$ and the FET Q4 is connected to the electrical ground.

While specific apparatus and method have been disclosed in the preceding description, and while representative ones of component numbers have been inserted parenthetically in some of the claims, it should be understood that these specifics have been given for the purpose of disclosing the principles of the present invention, and that many variations thereof will become apparent to those who are versed in the art. Therefore, the scope of the present invention is to be determined by claims included appended hereto without any limitation by numbers that may be parenthetically inserted in the claims.

What is claimed is:

1. Electronic apparatus (10, 20, 26, 30, 38, 48, 66, 70, 82, 90, 96, 100, 108, 118, or 122) which comprises:
   a solid-state electronic device (Q1, Q3, or Q5) that includes higher and lower dc voltage terminals;
   an other electronic device (Q2, Q4, Q6, Q7, Q8, 92, 110, 112, Q11, or Q12) that includes higher and lower dc voltage terminals;
   means, comprising means (L2) for connecting said lower dc voltage terminal of one of said electronic devices to said higher dc voltage terminal of an other of said electronic devices, for connecting said electronic devices in dc series between a dc source terminal and an electrical ground;
   means, comprising a capacitor (C5, C6, or C19) that is connected between said lower dc voltage terminal of said one electronic device and said electrical ground, for rf decoupling said dc series-connected electronic devices; and
   said means for if decoupling further comprises means (86) for making an effective series resistance, between said lower dc voltage terminal of said one electronic device and said electrical ground, lower than a porcelain capacitor that resonates at an rf frequency of said one electronic device.

2. Electronic apparatus (48, 66, 70, 82, 90, 96, 100, 108, 118, or 122) which comprises:
   a first electronic device (Q1, Q3, or Q5 that includes higher and lower dc voltage terminals;
   a second electronic device (Q2, Q4, Q6, 92, 110, 112, Q11, or Q12) that includes higher and lower dc voltage terminals;
   means, comprising means (L2) for connecting said lower dc voltage terminal of one of said electronic devices to said higher dc voltage terminal of an other of said electronic devices, for connecting said electronic devices in dc series between a dc source terminal and an electrical ground;
   means (54, 72 or VD1) for proportioning first and second percentages of a dc source voltage, when applied to said dc source terminal, to said first and second electronic devices, respectively;
   means, comprising a capacitor (C5, C6, or C19) that is connected between said lower dc voltage terminal of said one electronic device and said electrical ground, for rf decoupling said dc series-connected electronic devices; and
   said means for rf decoupling further comprises means (86) for making an effective series resistance, between said lower dc voltage terminal of said one electronic device and said electrical ground, lower than a porcelain capacitor that resonates at an rf frequency of said one electronic device.

3. Electronic apparatus (108, 118, or 122) which comprises:
   a baseband processing device (110) having higher and lower dc voltage terminals;
   a solid-state electronic device (Q1, Q2, or Q3), having higher and lower dc voltage terminals;
   means (112, Q11, Q12) for delivering an rf signal from said baseband processing device to said solid-state electronic device;
   means, comprising means (L2) for connecting said lower dc voltage terminal of one of said devices to said higher dc voltage terminal of an other of said devices, for connecting said devices in dc series between a dc source terminal end an electrical ground;
   means (VD1) for proportioning first and second percentages of a dc supply voltage, when applied to said dc source terminal, to respective ones of said devices; and
   means, comprising a capacitor (C5 or C19) that is connected between said lower dc voltage terminal of said one electronic device and said electrical ground, for rf decoupling said dc series-connected electronic devices.

4. Electronic apparatus (108, 118, or 122) which comprises:
   a baseband processing device (110) having higher and lower dc voltage terminals;
   a multiplier/up-converter (112) being connected in rf series to said baseband processing device;
   a solid-state amplifying device (Q1, Q3, or Q5) having higher and lower dc voltage terminals;
   means (Q11, Q12) for connecting said solid-state amplifying device in rf series to said multiplier/up-converter;
   means, comprising means (L2) for connecting said lower dc voltage terminal of said solid-state amplifying device to said higher dc voltage terminal of said baseband processing device, for connecting said solid-state amplifying device and said baseband processing device in dc series between a dc source terminal and an electrical ground;
   means (VD1) for proportioning first and second percentages of a dc supply voltage, when applied to said dc source terminal, to said solid-state amplifying device and to said baseband processing device, respectively; and means, comprising a capacitor (C5) that is connected between said lower dc voltage terminal of said solid-state amplifying device and said electrical ground, for rf decoupling said solid-state amplifying device and said baseband processing device.

5. A method for processing rf signals which comprises:
a) connecting a solid-state electronic device and an other electronic device in dc series between a dc source voltage and an electrical ground;
b) said connecting step comprises connecting a lower dc voltage terminal of one of said electronic devices to an rf choke, and connecting said rf choke to a higher dc voltage terminal of an other of said electronic devices;
c) separately processing rf signals in said electronic devices;
d) proportioning first and second percentages of said dc source voltage to separate ones of said electronic devices;
e) rf decoupling said electronic devices; and
f) said rf decoupling step comprises providing a capacitance between said lower dc voltage terminal and said electrical ground that is lower than an effective series resistance of a porcelain capacitor that resonates at an rf frequency of said one electronic device.

6. A method for processing rf signals which comprises:
a) connecting first and second electronic devices in dc series between a dc source voltage and an electrical ground;
b) separately processing rf signals in said first and second electronic devices;
c) proportioning first and second percentages of said dc source voltage between said first and second electronic devices;
d) rf decoupling said electronic devices; and
e) said rf decoupling step comprises providing a capacitance, between a lower dc voltage terminal of an upper one of said electronic devices and said electrical ground, that is lower than an effective series resistance of a porcelain capacitor that resonates at an rf frequency of said first electronic device.

7. A method for processing rf signals which comprises:
a) rf connecting a baseband processing device and a solid-state electronic device;
b) connecting said solid-state electronic device and said baseband processing device in dc series between a dc source terminal and an electrical ground;
c) said dc series-connecting step comprises connecting a lower dc voltage terminal of one of said devices to a higher dc voltage terminal of an other of said devices;
d) applying a dc source voltage to said dc source terminal;
e) separately proportioning first and second percentages of said dc source voltage to said devices;
f) rf decoupling said devices; and
g) said rf decoupling step comprises connecting a capacitor between said lower dc voltage terminal of said one device and said electrical ground.

8. A method for processing rf signals which comprises:
a) rf connecting a baseband processing device to a multiplier/up-converter;
b) rf connecting said multiplier/up-converter to a solid-state amplifying device;
c) connecting said solid-state amplifying device and said baseband processing device in dc series with a dc source terminal and an electrical ground;
d) said dc series-connecting step comprises connecting a lower dc voltage terminal of said solid-state amplifying device to an rf choke, and connecting said rf choke to a higher dc voltage terminal of said baseband processing device;
e) applying a dc source voltage to said dc source terminal;
f) proportioning first and second percentages of said dc source voltage to separate ones of said devices;
g) rf decoupling said solid-state amplifying device and said baseband processing device; and
h) said rf decoupling step comprises connecting a capacitor between said lower dc voltage terminal and said electrical ground.

9. Electronic apparatus (90, 96, 100, 108, 118, or 122) as claimed in claim 1 in which said other electronic device comprises a processing electronic device (92).

10. Electronic apparatus (108, 118, or 122) as claimed in claim 1 in which said other electronic device comprises a baseband processing device (110).

11. Electronic apparatus (108, 118, or 122) as claimed in claim 1 in which said other electronic device comprises a multiplied/up-converter (112).

12. Electronic apparatus (90, 96, 100, 108, 118, or 122) as claimed in claim 2 in which said second electronic device comprises a processing electronic device (92).

13. Electronic apparatus (108, 118, or 122) as claimed in claim 2 in which said second electronic device comprises a baseband processing device (110).

14. Electronic apparatus (108, 118, or 122) as claimed in claim 2 in which said second electronic device comprises a multiplier/up-converter (112).

15. Electronic apparatus (108, 118, or 122) as claimed in claim 3 in which said means for rf decoupling further comprises means (86) for making an effective series resistance, between said lower dc voltage terminal of said one electronic device and said electrical ground, lower than a porcelain capacitor that resonates at an rf frequency of said one electronic device.

16. Electronic apparatus (108, 118, or 122) as claimed in claim 4 in which said means for rf decoupling further comprises means (86) for making an effective series resistance, between said lower dc voltage terminal of said solid-state amplifying device and said electrical ground, lower than a porcelain capacitor that resonates at an rf frequency of said solid-state amplifying device.

17. Apparatus (48, 66, 70, 82, 90, 96, 100, 108, 118, or 122) as claimed in claim 1 in which said apparatus further comprises means (54, 72, or VD 1) for selectively and inversely proportioning a dc source voltage to said electronic devices (Q1, Q2, Q3, Q4, Q5, Q6, Q11, Q12, 92, 110, or 112).

18. Electronic apparatus (30, 38, 108, 118, or 122) as claimed in claim 1 in which said electronic devices (Q1 and Q7, Q1 and 110, Q3 and 110, Q5 and 110, or Q1 and 112) are connected in rf series.

19. Electronic apparatus (30, 38, 90, 96, 100, 108, 118, or 122) as claimed in claim 1 in which said apparatus further comprises mean (R7, R15, R16, Q8, Q11, Q12, 110, or 112) for increasing current flow through one of said electronic devices (Q1, Q2, Q3, Q5, 92, 110, or 112) without increasing current flow through an other of said electronic devices (Q1, Q2, Q3, Q5, 92, 110, or 112).

20. Electronic apparatus (30, 38, 108, 118, or 122) as claimed in claim 1 in which said apparatus further comprises means, comprising a third electronic device (Q8, Q11, Q12, 110, or 112), for increasing current flow through one of said electronic devices (Q1, Q2, Q3, or Q5) without increasing current flow through an other of said electronic devices (Q7, Q11, Q12, 110, or 112).

21. Electronic apparatus (30, 38, 108, 118, or 122) as claimed in claim 1 in which said apparatus further comprises means, comprising a resistor (R7, R15, or R16), for increasing current flow through one of said electronic devices (Q1, Q2, Q3, Q5, Q11, Q12, 110, or 112) without increasing current flow through an other of said electronic devices (Q1, Q2, Q3, Q5, Q8, Q11, Q12, 110, or 112).

22. Electronic apparatus (30, 38, 108, 118, or 122) as claimed in claim 1 in which said apparatus further comprises a third electronic device (Q8, Q11, Q12, 110, or 112) that is connected in dc parallel with one of said electronic devices (Q7, Q11, Q12, 110, or 112); and two of said electronic devices (Q1 and Q7, Q1 and 110, Q3 and 110, Q5 and 110, Q1 and 112, Q1 and Q11, or Q1 and A12) are connected in rf series.

23. Electronic apparatus (108, 118, or 122) as claimed in claim 3 in which said devices (Q1 and 110, 112, Q11, or Q12) are connected in rf series.

24. Electronic apparatus (108, 118, or 122) as claimed in claim 3 in which said apparatus further comprises means (R15, R16, Q11, Q12, 110, or 112) for increasing current flow through one of said devices (Q1, Q11, Q12, 110, or 112) without increasing current flow through an other of said devices (Q1, Q11, Q12, 110, or 112).

25. Electronic apparatus (108, 118, 122) as claimed in claim 3 in which said apparatus further includes means, comprising a third electronic device (Q11, Q12, or 112) for increasing current flow through one of said devices (Q1) without increasing current flow through an other of said devices (110).

26. Electronic apparatus (108, 118, or 122) as claimed in claim 3 in which said apparatus further includes means, comprising a resistor (R15 or R16) for increasing current flow through one of said devices (Q1 or 110) without increasing current flow through an other of said devices (Q1 or 110).

27. Electronic apparatus (108, 118, or 122) as claimed in claim 3 in which said apparatus further comprises a third electronic device (Q11, Q12, or 112) that is connected in dc parallel with one of said devices (110); and two of said devices (Q1 and 110, Q1 and 112, Q1 and Q11, or Q1 and Q12) are connected in rf series.

28. A method as claimed in claim 7 in which said method further comprises increasing current flow through one of said devices without increasing current flow through an other of said devices.

29. A method as claimed in claim 7 in which:
a) said method further comprises increasing current flow through one of said devices without increasing current flow through an other of said devices; and
b) said increasing step comprises connecting a resistor in parallel with said other device.

30. A method as claimed in claim 7 in which:
a) said method further comprises increasing current flow through one of said devices without increasing current flow through an other of said devices; and
b) said increasing step comprises connecting a third device in parallel with said other device.

31. A method as claimed in claim 7 in which said method further comprises:
a) connecting a third device in parallel with one of said devices; and
b) connecting said third device in rf series with said baseband processing device and said solid-state electronic device.

* * * * *

UNITED STATES PATENT AND TRADEMARK OFFICE
CERTIFICATE OF CORRECTION

PATENT NO. : 6,900,696 B2
APPLICATION NO. : 10/644115
DATED : May 31, 2005
INVENTOR(S) : Barry A. Lautzenhiser and Lloyd L. Lautzenhiser It is certified that error appears in the above-identified patent and that said Letters Patent is hereby corrected as shown below:

IN THE DRAWINGS:
Sheet 3/11, Figure 5, delete "C10", insert --C8--.
Sheet 4/11, Figure 7, delete "C3", insert --C2-- and delete "C2", insert --C3--.
Sheet 8/11, Figure 16, delete "C2", insert --C1--.
Sheet 10/11, Figures 17 and 18, delete "C2", insert --C1--.
Sheet 11/11, Figures 20 and 21, delete "C2", insert --C1--.

Column 17, Line 31, delete "UC", insert --L/C--.
Column 18, Line 32, delete "PDISS--", insert --PDISS=--.
Column 23, Line 23, insert --directly-- between --connected-- and --to--.

Column 24, Claim 2, Line 3, insert --)-- between --Q5-- and --that--.
Column 24, Claim 3, Line 14, delete "end", insert --and--.
Column 26, Claim 11, Line 3, delete "multiplied", insert --multiplier--.
Column 26, Claim 19, Line 3, delete "mean", insert --means--.
Column 27, Claim 22, Line 8, delete "A12", insert --Q12--.

Signed and Sealed this

Seventeenth Day of March, 2009

JOHN DOLL
*Acting Director of the United States Patent and Trademark Office*